(12) United States Patent
Oda et al.

(10) Patent No.: US 8,685,842 B2
(45) Date of Patent: Apr. 1, 2014

(54) METHOD OF MANUFACTURING SEMICONDUCTOR DEVICE

(71) Applicants: Minoru Oda, Kawasaki (JP); Tsutomu Tezuka, Yokohama (JP)

(72) Inventors: Minoru Oda, Kawasaki (JP); Tsutomu Tezuka, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 13/627,580

(22) Filed: Sep. 26, 2012

(65) Prior Publication Data

US 2013/0023092 A1   Jan. 24, 2013

Related U.S. Application Data

(63) Continuation of application No. PCT/JP2010/055937, filed on Mar. 31, 2010.

(51) Int. Cl.
*H01L 21/205*   (2006.01)
*H01L 21/36*   (2006.01)

(52) U.S. Cl.
USPC ................................... 438/478; 257/E21.09

(58) Field of Classification Search
USPC ................................... 438/478; 257/E21.09
See application file for complete search history.

(56) References Cited

U.S. PATENT DOCUMENTS

| 6,723,541 | B2 | 4/2004 | Sugii et al. |
| 6,727,550 | B2 | 4/2004 | Tezuka et al. |
| 7,005,676 | B2 | 2/2006 | Tezuka et al. |
| 7,557,018 | B2 | 7/2009 | Nakaharai et al. |
| 7,759,228 | B2 | 7/2010 | Sugiyama et al. |
| 2007/0287257 | A1* | 12/2007 | Damlencourt et al. ........ 438/285 |
| 2008/0220594 | A1* | 9/2008 | Clavelier et al. ............... 438/492 |
| 2009/0017602 | A1* | 1/2009 | Damlencourt et al. ........ 438/481 |
| 2011/0024804 | A1* | 2/2011 | Chang et al. ................... 257/288 |

FOREIGN PATENT DOCUMENTS

| JP | 2001-250775 A | 9/2001 |
| JP | 2001-298194 A | 10/2001 |
| JP | 2003-031495 A | 1/2003 |
| JP | 2005-072054 A | 3/2005 |
| JP | 2005-094006 A | 4/2005 |
| JP | 2005-129788 A | 5/2005 |
| JP | 2005-353701 A | 12/2005 |
| JP | 2009-188388 A | 8/2009 |

OTHER PUBLICATIONS

International Search Report dated Jun. 8, 2010 from PCT/JP2010/055937.

(Continued)

*Primary Examiner* — William D Coleman
*Assistant Examiner* — Christine Enad
(74) *Attorney, Agent, or Firm* — Ohlandt, Greeley, Ruggiero & Perle, L.L.P.

(57) ABSTRACT

According to one embodiment, a method of manufacturing a semiconductor device including forming a first SiGe layer on an insulating film, processing the first SiGe layer to have an island shape which includes a first region and a second region, the first region having a width larger than a width of the second region in a direction perpendicular to a connecting direction of the second region, subjecting the first SiGe layer having the island shape to thermal oxidation, thereby increasing Ge composition of the first and second region, and setting the Ge composition of the second region to be higher than the Ge composition of the first region, melting the second region having the increased Ge composition by heat treatment, and recrystallizing the melted second region from an interface between the first and second region.

19 Claims, 21 Drawing Sheets

(56) References Cited

OTHER PUBLICATIONS

Liu, et al.; "High-quality single-crystal Ge on insulator by liquid-phase epitaxy on Si substrates"; Applied Physics Letters, vol. 84, No. 14, Apr. 5, 2004; pp. 2563-2565.

Irisawa, et al.; "High-performance Uniaxially Strained SiGe-on-Insulator pMISFETs Fabricated by Lateral-Strain-Relaxation Technique"; IEEE Transactions on Electron Devices, vol. 53, No. 11, Nov. 2006, pp. 2809-2815.

Smith, Charles S.; "Piezoresistance Effect in Germanium and Silicon"; Physical Review, vol. 94, No. 1, Apr. 1, 1954, pp. 42-49.

English translation of IPRP dated Nov. 1, 2012 from PCT/JP2010/055937; 7 pages.

* cited by examiner

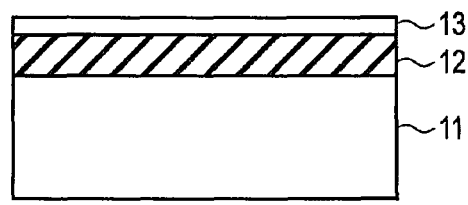
F I G. 1
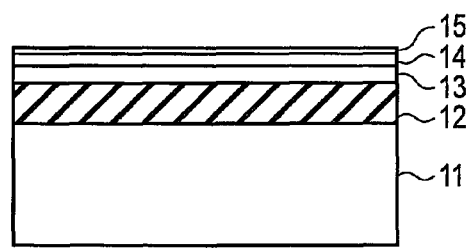
F I G. 2
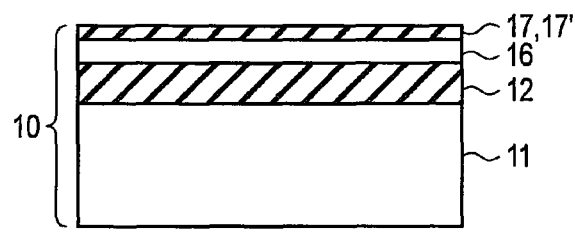
F I G. 3

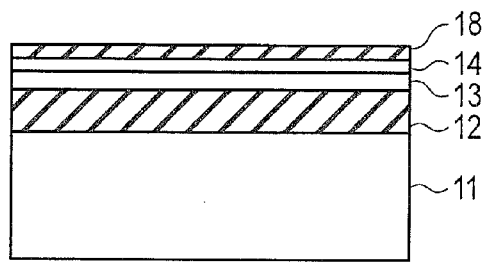
F I G. 4
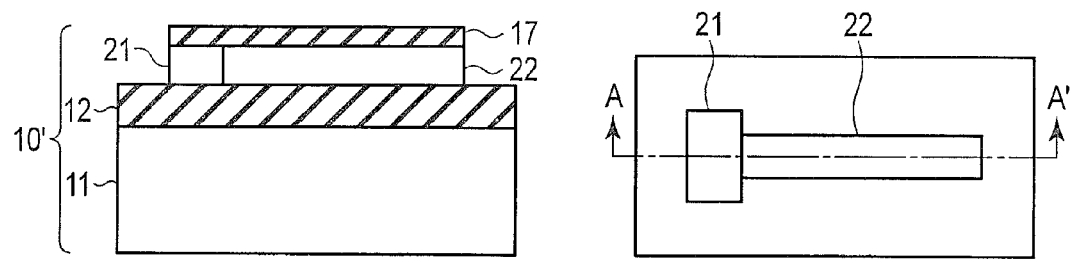
F I G. 5A               F I G. 5B

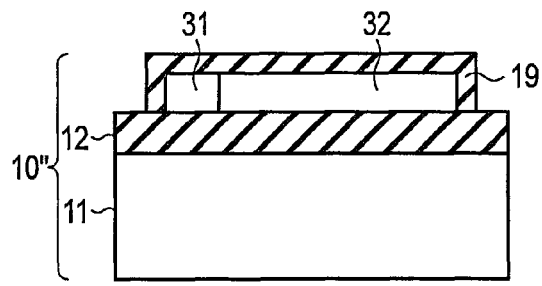 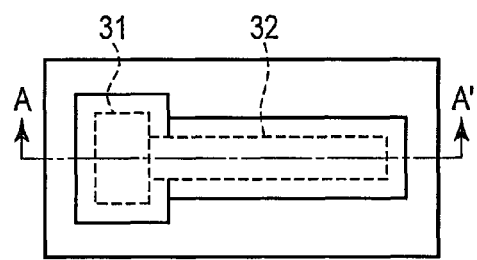
FIG. 6A             FIG. 6B
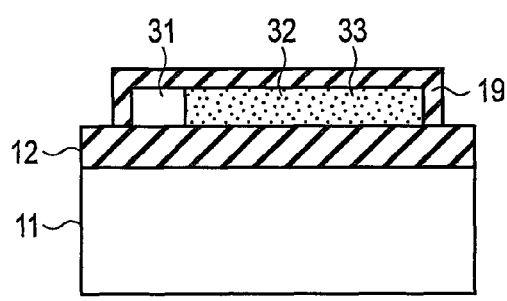 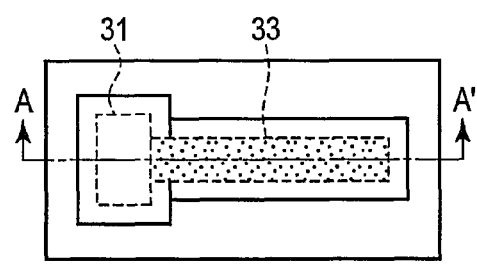
FIG. 7A             FIG. 7B

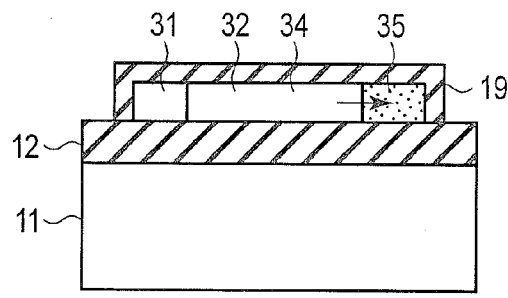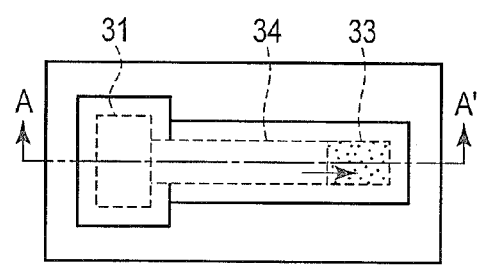
FIG. 8A    FIG. 8B
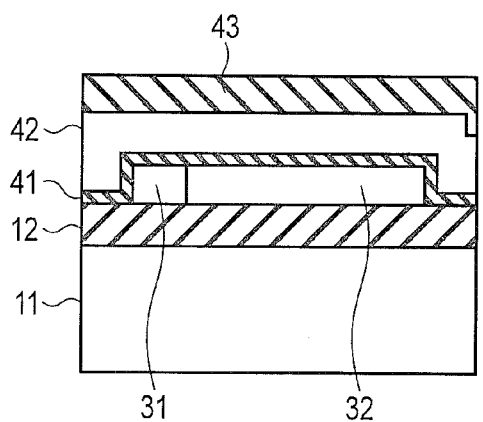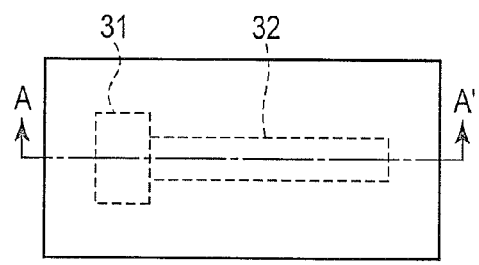
FIG. 9A    FIG. 9B

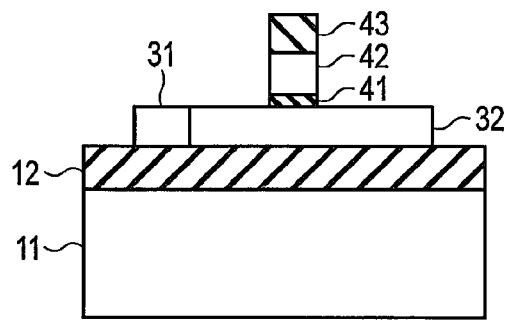
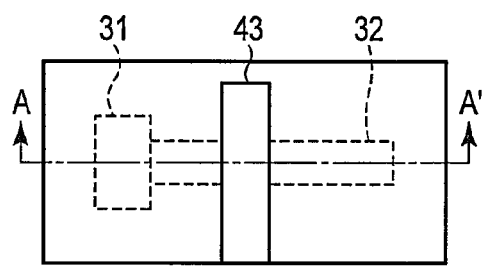
F I G. 10A  F I G. 10B
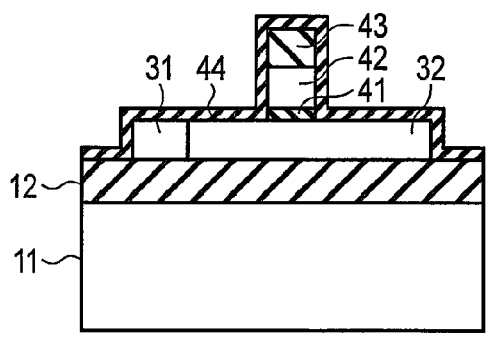
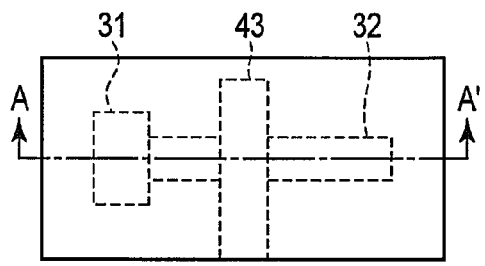
F I G. 11A  F I G. 11B

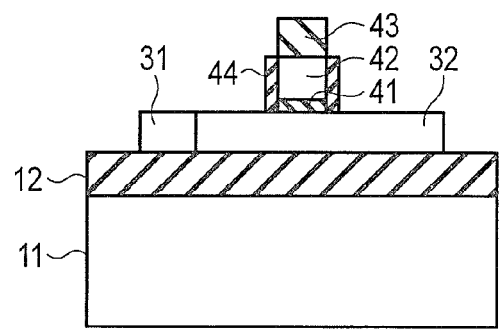
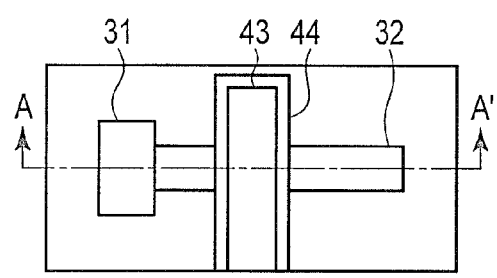
F I G. 12A
F I G. 12B
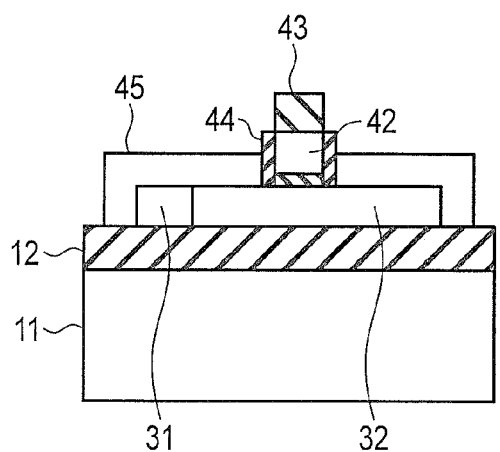
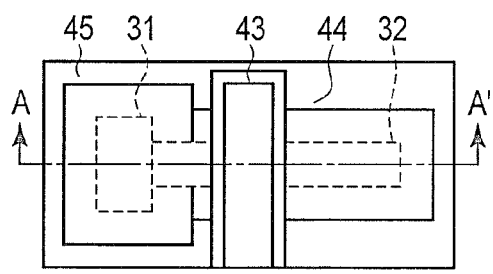
F I G. 13A
F I G. 13B

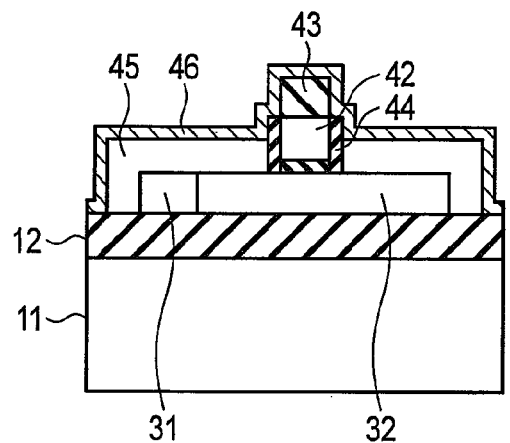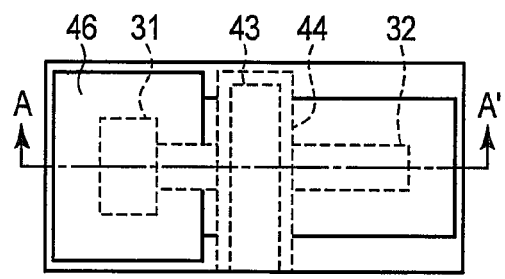
FIG. 14A         FIG. 14B
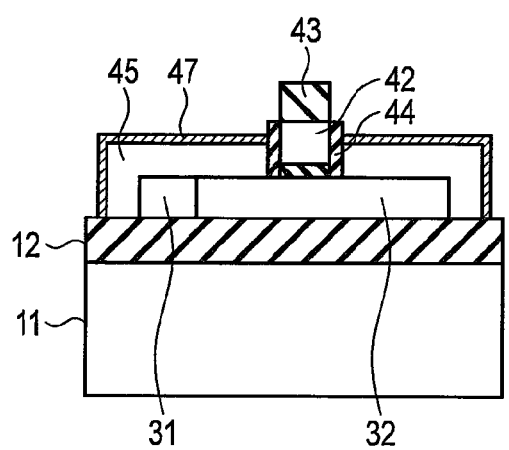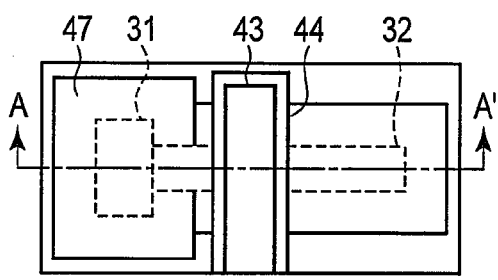
FIG. 15A         FIG. 15B

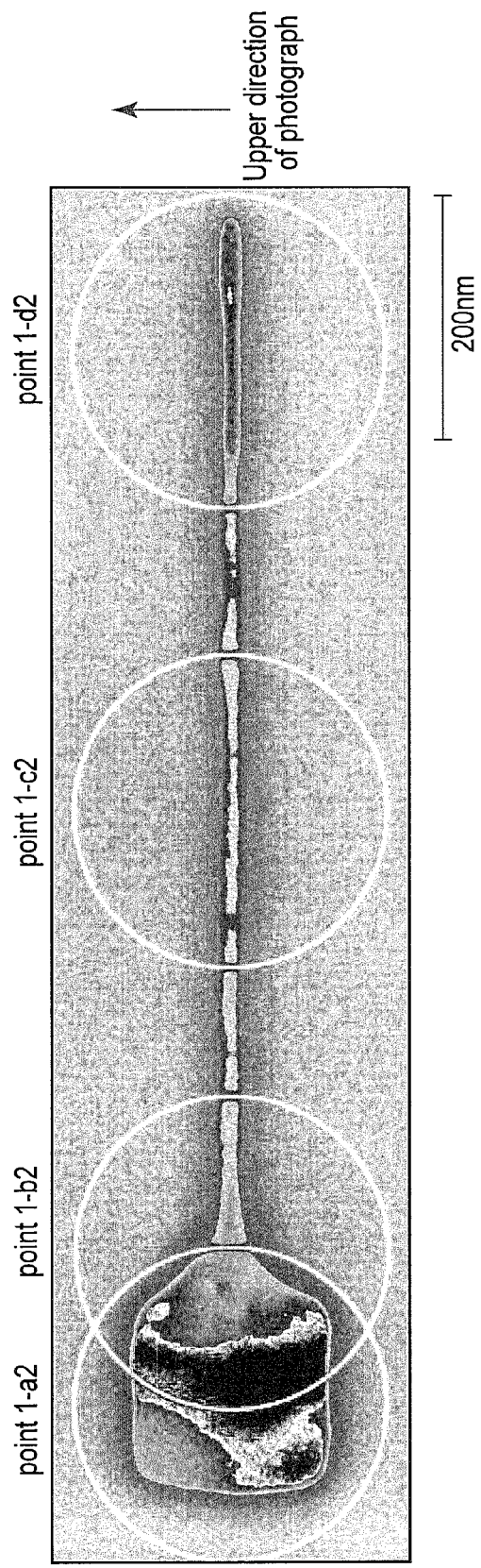
F I G. 18

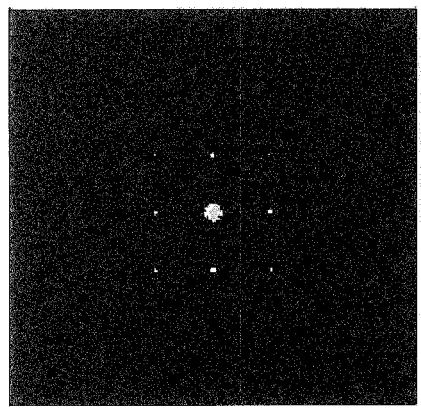
point 1-a2
F I G. 19A
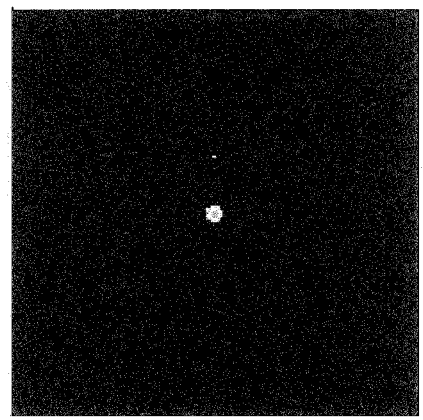
point 1-c2
F I G. 19C
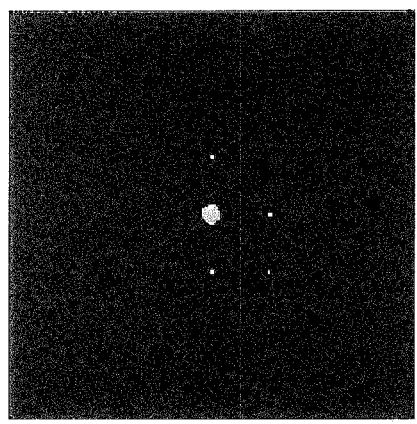
point 1-b2
F I G. 19B
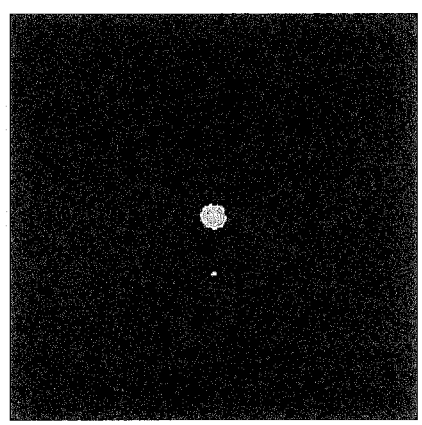
point 1-d2
F I G. 19D

|  | Average value before melting | Average value after melting |
|---|---|---|
| Ge composition (%) | 88 | 79 |
| Strain (%) | 2.2 | -0.1 |
F I G. 20
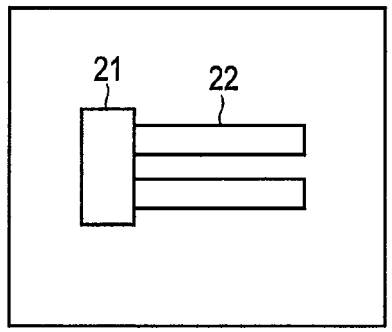
F I G. 21A
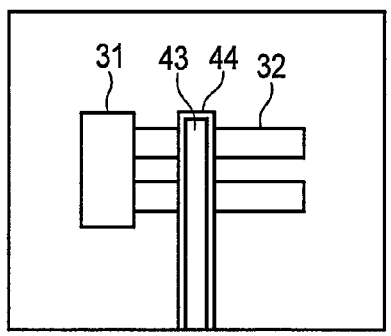
F I G. 21B
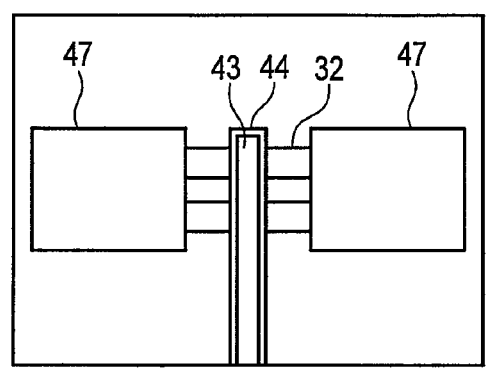
F I G. 21C

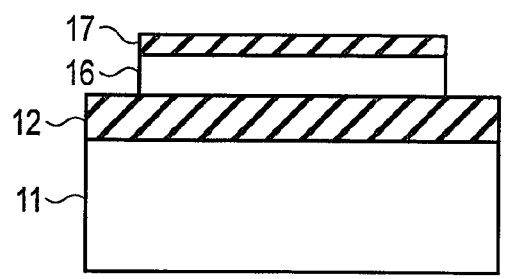 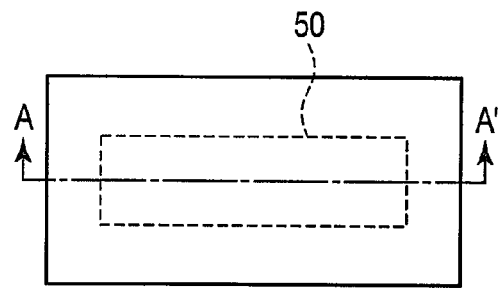
F I G. 22A    F I G. 22B
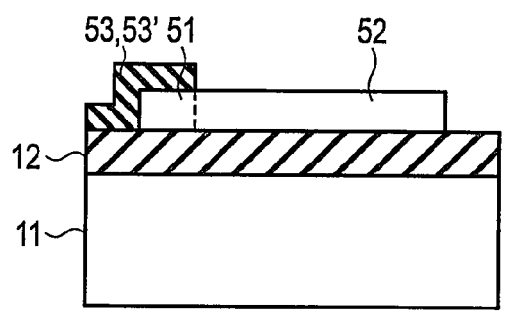 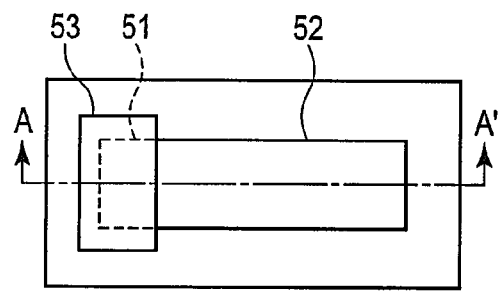
F I G. 23A    F I G. 23B

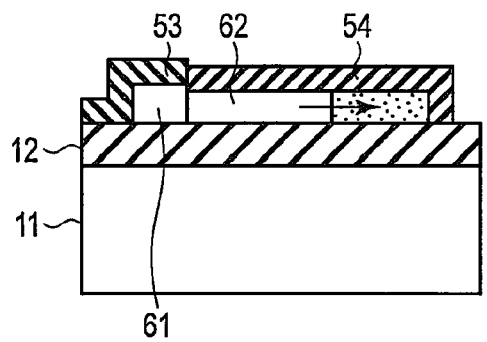
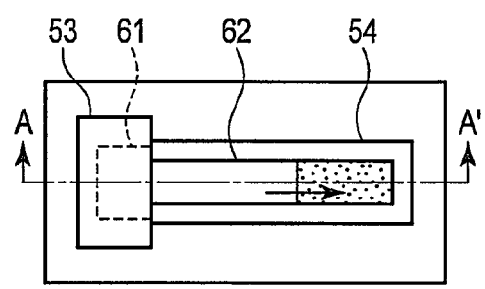
FIG. 26A    FIG. 26B
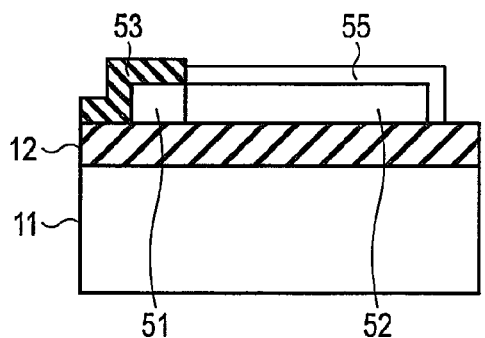
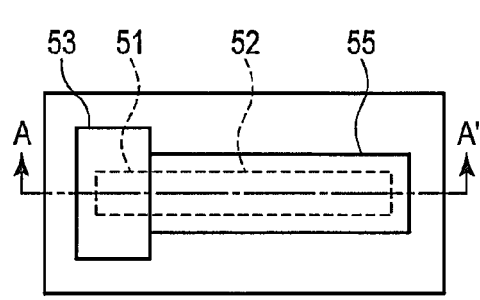
FIG. 27A    FIG. 27B

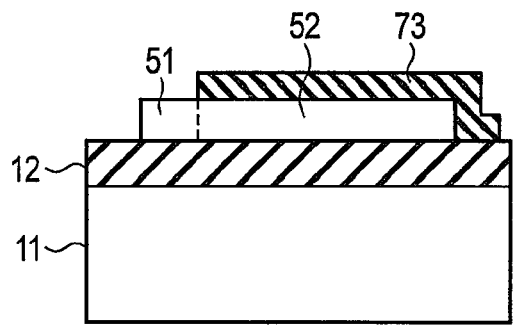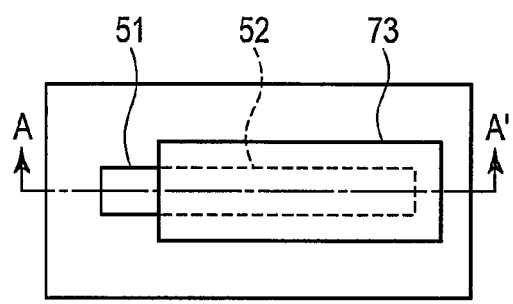
F I G. 28A          F I G. 28B
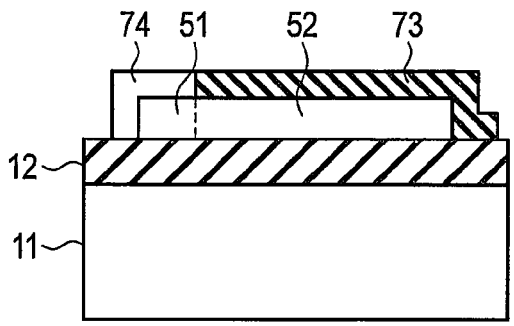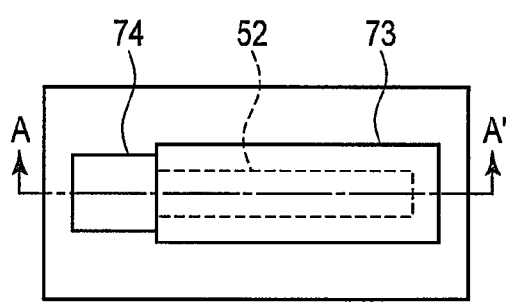
F I G. 29A          F I G. 29B

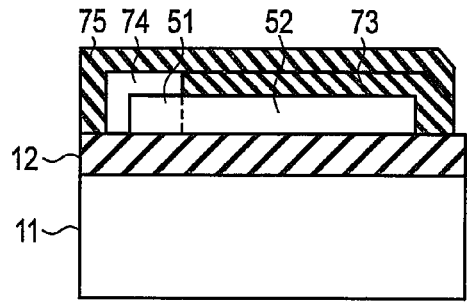 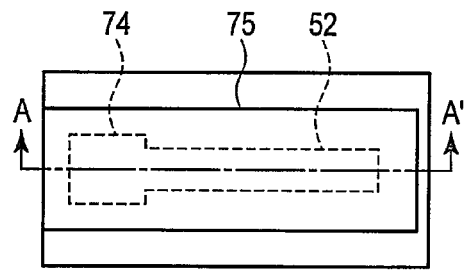
FIG. 30A          FIG. 30B
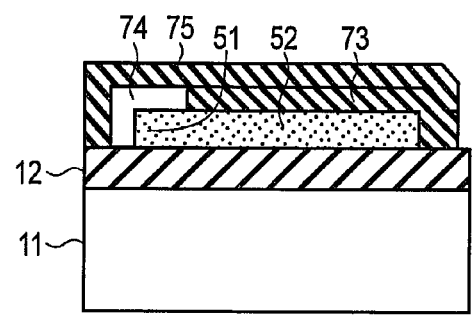
FIG. 31
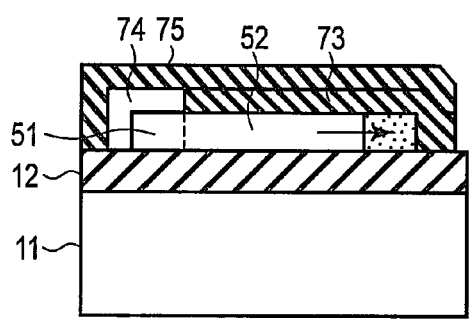
FIG. 32

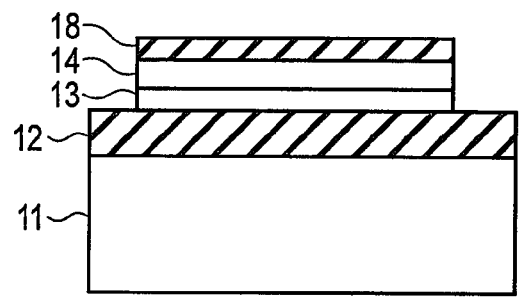
F I G. 33A
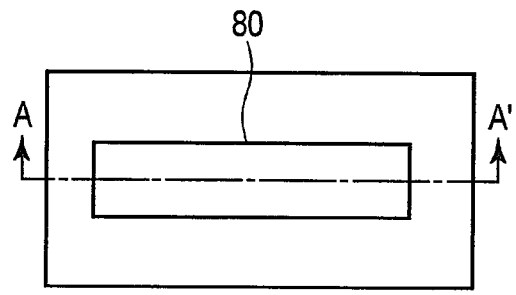
F I G. 33B
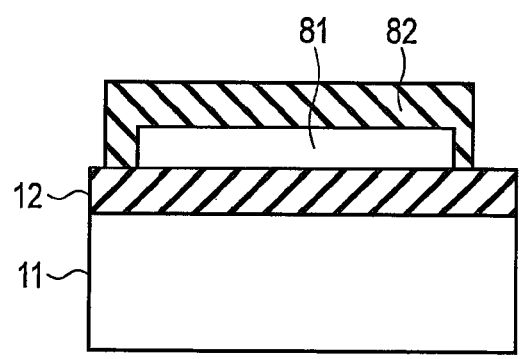
F I G. 34A
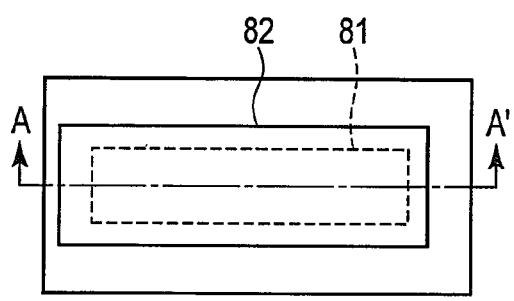
F I G. 34B

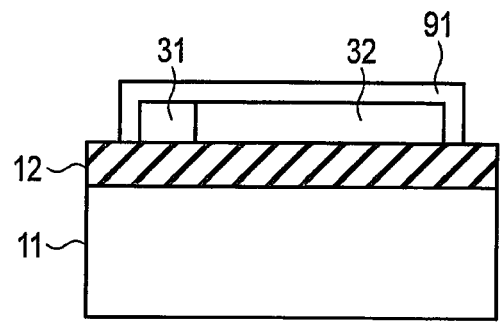
F I G. 37A
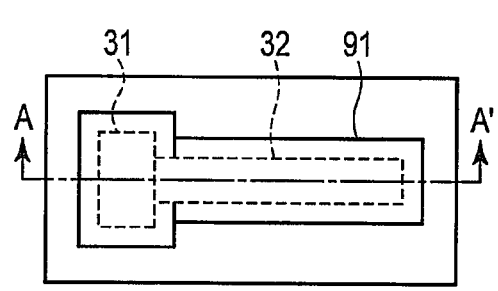
F I G. 37B
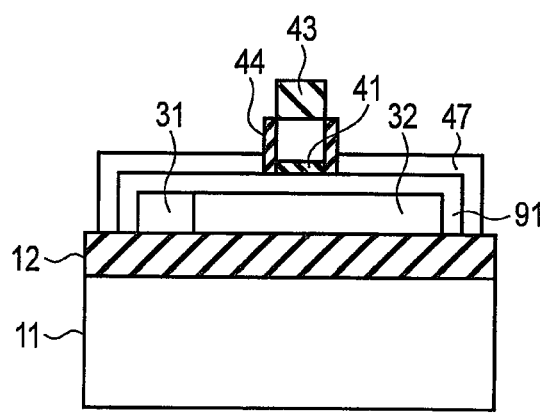
F I G. 38A
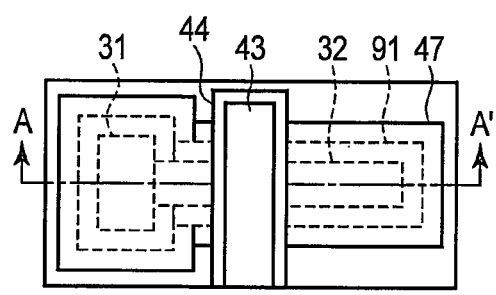
F I G. 38B

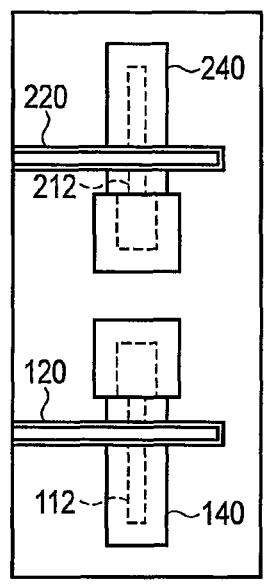
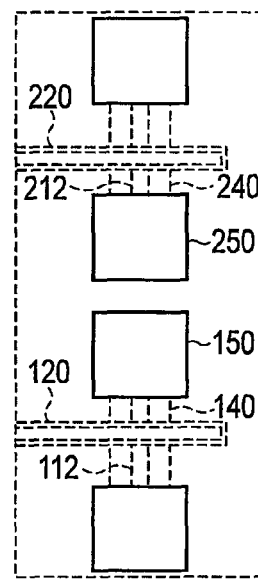
F I G. 39F      F I G. 39G
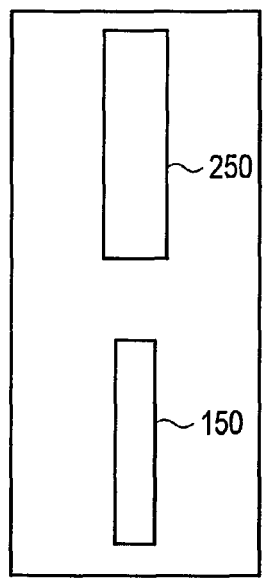
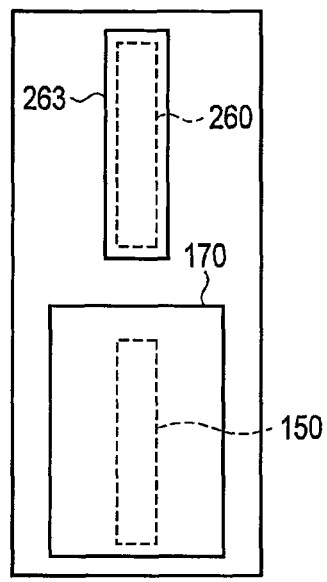
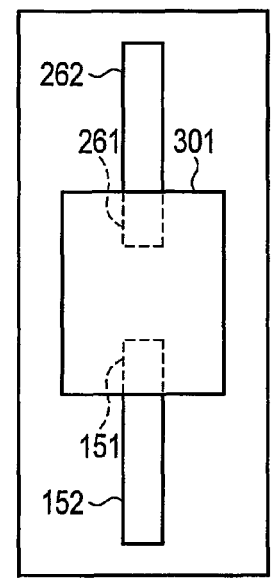
F I G. 40A      F I G. 40B      F I G. 40C

METHOD OF MANUFACTURING SEMICONDUCTOR DEVICE

CROSS REFERENCE TO RELATED APPLICATIONS

This application is a Continuation application of PCT Application No. PCT/JP2010/055937, filed Mar. 31, 2010, the entire contents of which are incorporated herein by reference.

FIELD

Embodiments described herein relate generally to a method of manufacturing a semiconductor device, for manufacturing a SiGe layer which is processed to have an island shape on an insulating film.

BACKGROUND

In recent years, it has been reported that a current drive drastically increases in multi-gate pMOSFETs with uniaxially compressive strain in (110) surface on an SGOI substrate (T. Irisawa et al., IEEE Trans. Electron Devices, 53, 2809 [2006]). For the SGOI multi-gate MOSFETs, an SGOI substrate should be prepared which can be got as following process. First, a SiGe layer is formed on an SOI substrate by epitaxial growth. Next, the SiGe/SOI substrate is oxidized in the oxygen atmosphere. This oxidation results in selective consumption of Si with regard to Ge, which is called as Ge condensation, and Ge composition increases as oxidation proceeds. Thereby an SGOI substrate of desired Ge composition can be formed. In the Ge condensation method, however, it has the following two problems.

The first problem is that an epitaxially grown SiGe layer cannot avoid being compressively strained because it has a larger lattice constant than that of SOI layer which supports the SiGe layer. This compressive strain is favorable for p-MOSFETs due to an increase of current drive. On the other hand, it is known that not compressive strain but tensile one can improve the characteristics of nMOSFETs (C. S. Smith, Phys. Rev., 94, 42 [1954]). Therefore, compressive strain in the SiGe layer is not desirable for the nMOSFETs. For an application to a CMOS circuit, it is useful to start with a strained SGOI substrate and then relax the channel only for nMOSFETs so as to apply tensile strain. But it is the most promising way to prepare a strain-relaxed SGOI substrate and then apply compressive/tensile strain to the channel for p/n-MOSFETs respectively by SiGe epitaxial growth. It is so hard, however, that a strain-relaxed SGOI substrate with high quality could be formed.

The second problem is that defects and dislocations in the SGOI layer should be generated by the compressive strain as the composition of Ge increases during Ge condensation. In particular, these defects and dislocations in the channel result in deterioration in mobility and junction leakage, which cause significant problems in device characteristics and reliability. Therefore, when a CMOS circuit is formed on the SGOI substrate, it is indispensable to achieve both relaxation of strain and reduction in defects in the SGOI layer.

BRIEF DESCRIPTION OF THE DRAWINGS

FIG. 1 is a cross-sectional view of a manufacturing step of a semiconductor device according to a first embodiment.

FIG. 2 is a cross-sectional view of a manufacturing step of the semiconductor device according to the first embodiment.

FIG. 3 is a cross-sectional view of a manufacturing step of the semiconductor device according to the first embodiment.

FIG. 4 is a cross-sectional view for explaining a modification of the first embodiment.

FIGS. 5A and 5B are a cross-sectional view and a plan view of a manufacturing step of the semiconductor device according to the first embodiment.

FIGS. 6A and 6B are a cross-sectional view and a plan view of a manufacturing step of the semiconductor device according to the first embodiment.

FIGS. 7A and 7B are a cross-sectional view and a plan view of a manufacturing step of the semiconductor device according to the first embodiment.

FIGS. 8A and 8B are a cross-sectional view and a plan view of a manufacturing step of the semiconductor device according to the first embodiment.

FIGS. 9A and 9B are a cross-sectional view and a plan view of a manufacturing step of the semiconductor device according to the first embodiment.

FIGS. 10A and 10B are a cross-sectional view and a plan view of a manufacturing step of the semiconductor device according to the first embodiment.

FIGS. 11A and 11B are a cross-sectional view and a plan view of a manufacturing step of the semiconductor device according to the first embodiment.

FIGS. 12A and 12B are a cross-sectional view and a plan view of a manufacturing step of the semiconductor device according to the first embodiment.

FIGS. 13A and 13B are a cross-sectional view and a plan view of a manufacturing step of the semiconductor device according to the first embodiment.

FIGS. 14A and 14B are a cross-sectional view and a plan view of a manufacturing step of the semiconductor device according to the first embodiment.

FIGS. 15A and 15B are a cross-sectional view and a plan view of a manufacturing step of the semiconductor device according to the first embodiment.

FIG. 18 is a diagram illustrating a result of TEM analysis of a SiGe layer after recrystallization.

FIG. 19A to FIG. 19D are diagrams illustrating grating patterns in respective points of FIG. 18.

FIG. 20 is a diagram illustrating a Raman spectroscopy result.

FIG. 21A to FIG. 21C are plan views for explaining a modification of the first embodiment, and illustrating a manufacturing process of a multi-channel Fin.

FIGS. 22A and 22B are a cross-sectional view and a plan view of a manufacturing step of a semiconductor device according to a second embodiment.

FIGS. 23A and 23B are a cross-sectional view and a plan view of a manufacturing step of the semiconductor device according to the second embodiment.

FIGS. 26A and 26B are a cross-sectional view and a plan view of a manufacturing step of the semiconductor device according to the second embodiment.

FIGS. 27A and 27B are a cross-sectional view and a plan view for explaining a modification of the second embodiment.

FIGS. 28A and 28B are a cross-sectional view and a plan view of a manufacturing step of a semiconductor device according to a third embodiment.

FIGS. 29A and 29B are a cross-sectional view and a plan view of a manufacturing step of the semiconductor device according to the third embodiment.

FIGS. 30A and 30B are a cross-sectional view and a plan view of a manufacturing step of the semiconductor device according to the third embodiment.

FIG. 31 is a cross-sectional view of a manufacturing step of the semiconductor device according to the third embodiment.

FIG. 32 is a cross-sectional view of a manufacturing step of the semiconductor device according to the third embodiment.

FIGS. 33A and 33B are a cross-sectional view and a plan view of a manufacturing step of a modification of the third embodiment.

FIGS. 34A and 34B are a cross-sectional view and a plan view of a manufacturing step of the modification of the third embodiment.

FIGS. 37A and 37B are a cross-sectional view and a plan view of a manufacturing step of a semiconductor device according to a fourth embodiment.

FIGS. 38A and 38B are a cross-sectional view and a plan view of a manufacturing step of the semiconductor device according to the fourth embodiment.

FIG. 39A to FIG. 39G are plan views of a manufacturing step of a semiconductor device according to a fifth embodiment.

FIG. 40A to FIG. 40C are plan views of a manufacturing step of a modification of the fifth embodiment.

DETAILED DESCRIPTION

Figures 16A, 16B:
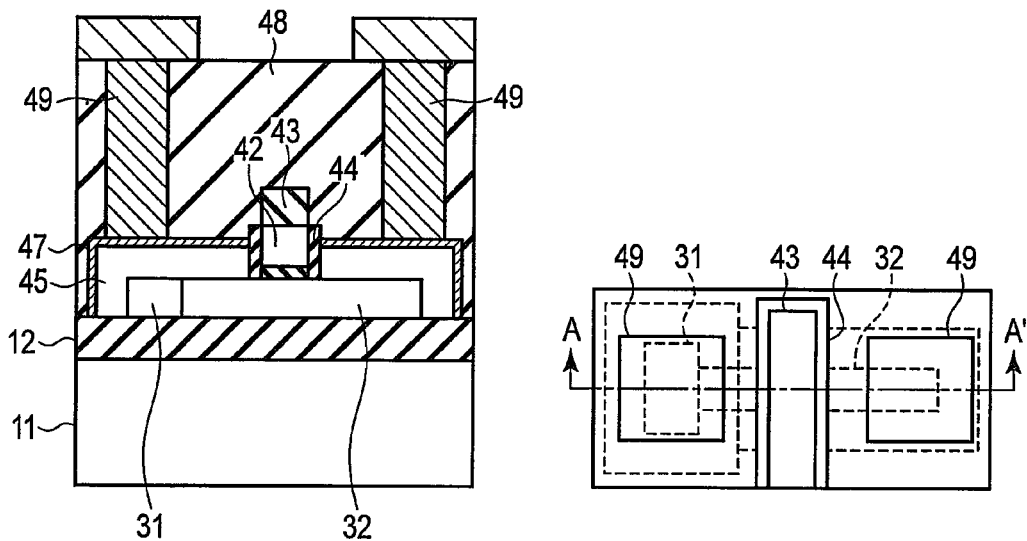
FIGS. 16A and 16B are a cross-sectional view and a plan view of a manufacturing step of the semiconductor device according to the first embodiment.

In general, according to one embodiment, a method of manufacturing a semiconductor device comprising:

forming a first SiGe layer on an insulating film;

processing the first SiGe layer to have an island shape which includes a first region and a second region that is connected to the first region, the first region having a width larger than a width of the second region in a direction perpendicular to a connecting direction of the second region;

subjecting the first SiGe layer having the island shape to thermal oxidation, thereby increasing Ge composition of the first region and Ge composition of the second region, and setting the Ge composition of the second region to be higher than the Ge composition of the first region;

melting the second region having the increased Ge composition by heat treatment; and recrystallizing the melted second region from an interface between the first region and the second region.

Embodiments will be explained hereinafter with reference to drawings.

In the following embodiments, a tri-gate FinFET will be explained as an example. However, the present embodiments are not limited to a tri-gate Fin, but applicable to other multi-gate structures which have a plurality of gate electrodes. Examples of the structure which includes a plurality of gate electrodes are a double-gate structure in which gate electrodes are arranged above and under the channel or on both sides of the channel, and a gate-all-around structure in which the channel is surrounded by gate electrodes. In particular, transistors which have a channel size (Fin width) of about 10 nm or less are also called nanowire transistors.

In addition, a structure in which gates are formed on both sides of a channel (Fin) of a mesa structure which is formed in a plate shape perpendicularly to the substrate is called a FinFET, and a structure in which gates are formed on three surfaces of the left and right side surfaces and the upper surface is called a tri-gate FET. These structures are collectively called multi-gate structures, and have increased electrostatic controlling power of channel carriers by the gates, in comparison with an ordinary single gate structure of a planar type. Therefore, these structures have a characteristic that a short channel effect can be suppressed even in a state where the impurity concentration of the channel is maintained at low value.

First Embodiment

A method of manufacturing a semiconductor device according to a first embodiment will be explained hereinafter with reference to FIG. 1 to FIG. 16A and FIG. 16B.

FIG. 1 to FIG. 4 are cross-sectional views of an SOI substrate and an SGOI substrate before a Fin is formed. FIGS. 5A and 5B to FIGS. 16A and 16B illustrate cross-sectional views (A) and plan views (B), and the structure of (A) corresponds to a cross section taken along line A-A' of the structure (B).

In addition, although the present embodiment shows only a single SGOI-Fin, the present embodiment is not limited to a single Fin, but may include a multi-Fin which includes a plurality of Fins between a source and a drain. In the case of forming a multi-Fin, the width (width in a direction of arranging Fins) of the source/drain regions which spread over a plurality of Fins is desirably 100 nm or less, although the width depends on the number of Fins.

First, as illustrated in FIG. 1, an SOI substrate which includes a support substrate 11 such as Si, an embedded insulating film 12, and an SOI layer 13 is prepared. The SOI layer typically has a thickness of 10 to 100 nm, and a main surface of the substrate is a (100) face. The main surface of the SOI substrate may be a face other than the (100) face.

Next, as illustrated in FIG. 2, a $Si_{1-x}Ge_x$ layer 14 ($0<x\le1$) having a thickness of 20 to 200 nm and a Si cap layer 15 having a thickness of about 5 nm are epitaxially grown successively by CVD, and thereby a $Si/Si_{1-x}Ge_x/SOI$ substrate is formed.

Next, oxidation-induced condensation called as Ge condensation is performed until the $Si/Si_{1-x}Ge_x/SOI$ substrate has desired Ge composition and a desired thickness. The following is explanation of Ge condensation. A substrate which includes Si and Ge on an insulating film, such as $Si/Si_{1-x}Ge_x/SOI$, is oxidized at high temperature and in an oxygen atmosphere. Thereby, due to difference in free energy between Ge and Si in $SiO_2$ which is formed on the surface of the substrate, Ge is expelled from $SiO_2$, and only Si selectively reacts with oxygen to form $SiO_2$. Therefore, only Si of the SiGe layer is consumed by an ordinary oxidation process, and the concentration of Ge increases. In addition, the Ge composition of the SiGe layer increases, as oxidation advances. This phenomenon is called Ge condensation. The $SiO_2/Si_{1-y}Ge_y/SiO_2/Si$ substrate generated by Ge condensation is called a silicon-germanium-on-insulator (SGOI) substrate.

By using the Ge condensation, the substrate is annealed first in an oxygen atmosphere at 1100° C. or more. Thereby, Ge condensation is performed while Si and Ge are sufficiently diffused in the SiGe layer 14 and the Si layers 13 and 15. During this process, Ge condensation can be performed while the temperature is gradually decreased, to avoid melting of the SiGe layer due to increase of the Ge composition. Thereby, as illustrated in FIG. 3, obtained is an SGOI substrate 10 which includes an SGOI layer 16 that includes a desired Ge composition (0.1<y≤1) and a desired thickness (about 5 to 100 nm), and a thermal oxide film 17.

Ge condensation is not necessarily performed at this step. In this case, an SGOI substrate as illustrated in FIG. 4, which is obtained by successively depositing a $Si_{1-x}Ge_x$ layer 14 (0.1<x≤1) which has a thickness of about 5 to 100 nm, and a $SiO_2$ layer 18 on the SOI substrate illustrated in FIG. 4, may be formed. The SGOI substrate can be used instead of the SGOI substrate 10 of FIG. 3 in the following process. The following explanation shows an example of using the SGOI substrate of FIG. 3.

Next, ion implantation is performed to introduce dopant into the channel. First, the thermal oxide film 17 which covers the SGOI substrate 10 is etched to the desirable thickness by hydrofluoric acid or the like, or a nitride film is deposited instead of the thermal oxide film. Then, B (boron) in the case of n-MOSFET, or P (phosphorus) or As (arsenic) in the case of p-MOSFET, is introduced by ion implantation from an upper surface of the thermal oxide film 17 or nitride film 17' serving as a protective film. Then, activation annealing is performed after ion implantation. This step can be omitted since high temperature thermal annealing will be performed hereafter.

Next, the thermal oxide film 17 or nitride film 17' is subjected to lithography by excimer laser or electron beam (EB). Thereafter, reactive ion etching (RIE) is performed, with the thermal oxide film 17 or the nitride film 17' used as a mask. Thereby, as illustrated in FIG. 5A and FIG. 5B, the SiGe layer 16 is processed to have an island shape in which a first region 21 is connected with a second region 22. By this step, an SGOI substrate 10' is obtained as illustrated in FIG. 5A and FIG. 5B. The first region 21 has a width which is larger than a width of the second region in a direction perpendicular to an A-A' direction.

In the following explanation, the wider first region 21 is generally referred to as a source region, and the narrower second region 22 is generally referred to as a Fin region. During this step, the Fin region 22 is processed to have an island shape, such that (110) faces are formed on side surfaces thereof for which the channel is along <110> direction on the (100) oriented substrate.

Next, after the hard mask 17 or 17' is removed, the SGOI substrate 10' is subjected to Ge condensation in a three-dimensional manner in an oxygen atmosphere and at a temperature of 800° C. or more. Thereby, as illustrated in FIG. 6A and FIG. 6B, a thermal oxide film 19 is formed, and a source region 31 and a Fin region 32 with increased Ge composition are formed. The step of removing the hard mask 17 or 17' may be omitted. Since the thermal oxide film is formed with almost equal thickness on each of the upper surface and both the side surfaces of the source region and the Fin region, the volume of the rest SiGe for the oxide film in the Fin region is relatively smaller than that of the source region. As a result, the rate of increase of the Ge composition in the Fin region 22 is larger than that in the source region 21. Therefore, the source region 21 and the Fin region 22 in FIG. 5B are condensed into the source region 31 which has a relatively low Ge composition and the Fin region 32 which has a relatively high Ge composition, respectively, as illustrated in FIGS. 6A and 6B. Specifically, gradation of the Ge composition is formed.

At this step, in consideration of latitude in selection of the temperature in thermal processing in melting and recrystallization, the difference in the Ge composition is desirably 40% or more. This is because the interval between the liquid-phase line and the solid-phase line at certain temperature corresponds to the difference in the maximum Si composition (specifically, the difference in Ge composition), that is, about 40%, in view of the solid-liquid phase diagram of SiGe illustrated in FIG. 17. For example, suppose that the initial Ge composition is 20% both in the source region 21 and the Fin region 22, the Fin width is 30 nm, the source region width is 50 nm, and both the Fin region and the source region have a height of 30 nm. In this example, when Ge condensation is preformed such that $SiO_2$ is formed with a thickness of 23 nm, the Ge composition of the Fin region 32 is increased to 90%, and the Ge composition of the source region 31 is increased to 50%.

As described above, it is possible to obtain an SGOI substrate 10'' in which an SGOI-Fin which has a Ge composition gradation between the source region 31 and the Fin region 32, and is covered with the oxide film 19 is formed on an insulating film. It is important for an application that the Fin region 32 has an end width of 5 to 20 nm, an end height of 5 to 50 nm, and a Ge composition of 0.3<z≤1.

Then, the SGOI substrate 10'' is annealed at high temperature in a rare gas or nitrogen gas atmosphere. The atmosphere may include some oxygen (about 1% or less of the volume). The term "high temperature" in this treatment indicates a temperature at which only the Fin region 32 having high Ge composition is melted, while the source region 31 having low Ge composition is not melted. During the annealing, as illustrated in FIG. 7A and FIG. 7B, the thermal oxide film 19 serves as coating, and prevents the internal Si and Ge from flowing out due to elimination and liquefaction. Therefore, only the Fin region 32 is changed to the liquid phase 33, and the source region 31 is in the solid phase. For example, annealing should be performed at a temperature which is greater than or equal to 1020° C. and less than 1050° C. in the example of the above Ge composition (that is Fin region and source region has 90% and 50%, respectively), with reference to FIG. 17 which is a binary system phase diagram of SiGe. In this state, the Fin region 32 which has a Ge concentration of 90% is in the liquid phase, and the source region 31 which has a Ge concentration of 50% is in the solid phase.

As described above, only the Fin region 32 which has a high Ge composition is changed to the liquid phase 33. On the other hand, almost all part of the source region 31 which has a low Ge composition remains solid phase and some part of it may be recrystallized from the solid phase in the source region 31 used as seed crystal, by slowly reducing the temperature. During this step, as illustrated in FIG. 8A and FIG. 8B, the source region 31 is kept in the solid phase 31 or partially melt and crystallized into the solid phase 34, and then the Fin region 32 is changed to the solid phase 34. A Fin tip region 35 which is located on an edge that is more distant from the source region 31 goes through a liquid phase or a transitional state in which two phases exist together. When the temperature is further reduced, the whole region including the source region 31 and the Fin region 32 is changed to the solid phase 34 in the end, through a transitional state as illustrated in FIG. 8A and FIG. 8B. Thereby, recrystallization is finished. During the recrystallization, the Fin region 32 which serves as a channel region is entirely melted, and thus compressive strain is relaxed. In addition, since recrystallization is performed, crystal defects and dislocations which existed in the Fin region 32 before melting are removed.

Next, after the thermal oxide film 19 is removed by hydrofluoric acid, a gate insulating film 41, a gate electrode 42, and a gate electrode hard mask 43 are deposited, as illustrated in FIG. 9A and FIG. 9B. As the gate insulating film 41, it is possible to use a high-dielectric material such as $HfO_2$, HfSiON, $HfSiO_2$, $HfO_2$, $HfAlO_x$, $ZrO_2$, $Al_2O_3$, LaAlO, and $LaAlO_3$, or a layered structure formed of a layer of the above high-dielectric material and an interface layer formed of $SiO_2$ or $GeO_2$. It is also possible to use a SiON film as the gate insulating film 41. As a matter of course, it is possible to use an ordinary thermal oxide film ($SiO_2$).

As the gate electrode 42, it is possible to use Ni silicide, Ni germanide (Ni1-xGex), Ni germanosilicide (NiSi (Ge)), Pt silicide, Pt germanide, Pt germanosilicide, NtPt silicide, NiPt germanide, NiPt germanosilicide, W silicide, TiN, TiSiN, TaN, TaSiN, WN, AlN, Ti, Al, or Mo. As the hard mask 43, it is possible to use an insulating film such as an oxide film and a nitride film.

Next, as illustrated in FIG. 10A and FIG. 10B, lithography is performed by using EB or excimer laser. Then, RIE is performed for the gate electrode 42 and the gate insulating film 41, and thereby a gate-stack region is formed.

Then, as illustrated in FIG. 11A and FIG. 11B, a side wall insulating film 44 such as a nitride film is deposited, and thereafter the whole substrate is etched by RIE. Thereby, as illustrated in FIG. 12A and FIG. 12B, it is possible to form a side wall which is formed of the insulating film 44 that is left only on the both side of the gate-stack.

Next, as illustrated in FIG. 13A and FIG. 13B, $Si_{1-s}Ge_s$ ($0<s<1$) is selectively and epitaxially grown by CVD on the source region 31 and the rest of Fin region 32 on which the gate-stack region is not deposited. It is desirable that the $Si_{1-s}Ge_s$ film which serves as a stressor 45 has Ge composition which is larger or smaller by 0.2 or more than the Ge composition z of the Fin region 32 which serves as the channel region. For a pMOSFET, the Ge composition of the stressor 45 should satisfy $z<s$ since compressive strain is applied to the channel, and that of an nMOSFET should satisfy $s<z$ since tensile strain is applied to the channel.

Then, ions such as P, B, As, S, N, and Er are implanted into the source/drain region, and activation annealing is performed. This step may be performed before the stressor is performed, in some cases.

Next, as illustrated in FIG. 14A and FIG. 14B, a metal layer 46 is deposited. It is possible to use Ni or Pt for the metal layer 46. Thereafter, the metal layer is changed to germanide, silicide, or germanosilicide. Thereby, as illustrated in FIG. 15A and FIG. 15B, a germanosilicide region 47 is partly formed, to leave the effect of the strain stressor. A part of the metal layer which did not react is removed by hydrochloric acid or the like, and the source/drain regions are formed.

Next, as illustrated in FIG. 16A and FIG. 16B, an interlayer insulating film 48 is deposited, and thereafter contact holes to the gate electrode and source/drain electrodes are formed (only contact holes to the source/drain electrodes are illustrated). Via holes 49 are formed by filling the contact holes with conductive material. Then, after the electrodes are formed, wires are formed on the interlayer insulating film, and thereby a circuit which includes a MOS transistor is finished.

A result of recrystallizing a SiGe layer by the method explained in the present embodiment will be described hereinafter.

An SOI substrate which includes an SOI layer that has a thickness of 56 nm, $Si_{0.9}Ge_{0.1}$ was epitaxially grown with a thickness of 60 nm and Si was epitaxially grown with a thickness of 5 nm by CVD. Next, the substrate was oxidized at 1150° C. for 53 minutes. As a result of evaluating the substrate by ellipsometry, it was found that an SGOI substrate having a thickness of 56 nm was obtained. Then, the SGOI substrate was subjected to lithography to etch the SGOI layer by RIE, and thereby a Fin region and a source region were formed. The substrate was observed by an SEM, to evaluate the structures of the source region and the Fin region after RIE. As a result, it was found that the source region was formed in a square having a side of 230 nm, the Fin width was 85 nm, and the Fin length was 1 μm. When the Ge composition was evaluated by Raman measurement, the Ge composition was 8.0%. When the above results was collected together, the SGOI substrate 10 had a side of the source region of 230 nm, a Fin width of 85 nm, a Fin height of 57 nm, a Fin length of 1 μm, and the Ge composition of 8.0%.

Figure 17:
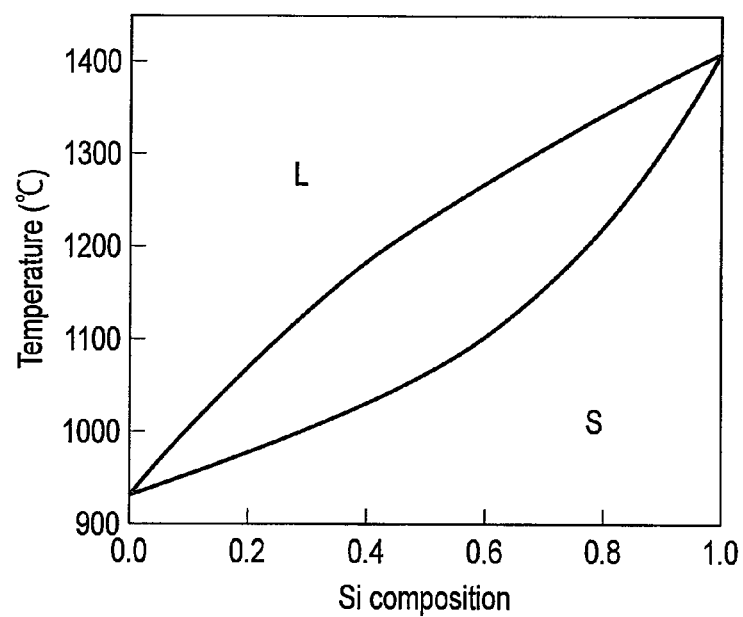
FIG. 17 is a diagram illustrating a phase state of SiGe, with the Si composition and the temperature used as parameters.

Next, this sample was oxidized for 2 hours and 42 minutes under the condition of 900° C. and in an oxygen atmosphere of 100%. When the sample was evaluated by Raman spectroscopy, it was found that the Ge composition of the Fin region which had a Fin width of 85 nm and a length of 1 μm was condensed to 88% (Si composition was 12%) by Ge condensation. The average strain of the sample in a Fin region was 2.2%, supposing that the compressive strain was positive and the tensile strain was negative. The average Ge composition of the source region of the sample was 36% (Si composition was 64%), supposing that the oxide film had the same thickness as the Fin region which was estimated by the Ge composition in the Fin region. Based on this result, the temperature of the sample was increased to 1090° C., at which the source region is in the solid-phase state and the Fin region is completely melted, in an $N_2$ atmosphere of 100%, with reference to the binary system phase diagram of Si and Ge in FIG. 17. In FIG. 17, S indicates the solid phase, and L indicates the liquid phase. In addition, heating was immediately stopped when the sample reached the target temperature, and thereby the temperature was decreased to recrystallize the Fin region. The average decreasing rate of the temperature in this treatment was 9° C./min at 1000° C. or more, and 6° C./rain at 900° C. or more.

Strain evaluation after recrystallization by heating was performed by Raman spectroscopy, and crystallinity was evaluated by TEM analysis. FIG. 20, FIG. 18, and FIG. 19 illustrate a result of the evaluation. As illustrated in FIG. 20, it found that average strain of the Fin region having the Fin width of 85 nm and a length of 1 μm was −0.1%. In consideration of the measurement accuracy, this result means that the strain is almost completely relaxed. As described above, an almost relaxed SiGe-Fin region was obtained. FIG. 18 illustrates a result of TEM analysis of the source region and the Fin region after recrystallization. The TEM image of FIG. 18 shows that the Fin of the SiGe layer is uniform over 1 μm. In addition, it is proved that whole the Fin region is a single crystal judging from the FIG. 19A to FIG. 19D, which show the electron line diffraction images of the TEM image corresponding to points a to d, respectively, of FIG. 18. In FIG. 19C and FIG. 19D, the Fin tip is slightly curved in the longitudinal direction by strain which is considered to be caused by a curve generated when the TEM sample was prepared.

These TEM images show that a uniform monocrystal is obtained through the whole area of 1 μm from the source region to the edge of the Fin region. In addition, no dislocations or surface defects were found inside the Fin as long as these TEM images were taken. From the above results, it was found that strain-relaxed and single-crystal SGOI region without any defects was obtained, which are the main effects of the present embodiment.

As described above, according to the present embodiment, it is possible to release the strain in the channel of the Fin MOSFET which uses SiGe as a channel, and reduce defects.

Therefore, it is possible to contribute to improve the device characteristics, and thus the present embodiment is applicable to a 16 nm node.

There exists other ways to melt and recrystallize SGOI layer. In one way, SiGe or Ge on an insulator is recrystallized from a Si seed under the insulator through an opening in the insulator (for example, see Applied Physics Letters, Vol. 84, No. 14, p. 2563). This method, however, requires a step of forming the opening of an insulating film and causes complex procedures. In addition, the method requires a seed region in which an opening is formed in the insulating film, and thus is disadvantageous with respect to area. There is also a melting and recrystallizing method to utilize laser or electron beam which enables us to melt and recrystallize only focused area (for example, JP-A 2001-298194 (KOKAI)). In this method, however, a grain boundary is generated in a center part which serves as the channel, and the grain boundary may be left in the channel. This is considered to have a harmful influence on the device characteristics of the transistor, such as a degradation of mobility.

In comparison with this, according to the present embodiment, the second region is recrystallized by using the first region of the SiGe layer as the seed, using the difference in Ge composition of SiGe on the insulating film. Therefore, it is unnecessary to form an opening in the insulating film, and no grain boundary is left in the second region serving as the channel.

In addition, the present embodiment has the characteristic that the source region and the Fin region have the width aspect ratio, and Ge composition gradation is automatically formed by Ge condensation. In this structure, only the oxidation process is performed, and thus the process can be regarded as a simple process.

When the present embodiment is applied to a multi-channel Fin, at the step illustrated in FIG. 5A and FIG. 5B, the SiGe layer 16 is processed to have a island shape in which the first region 21 is connected with a plurality of second regions 22, as illustrated in FIG. 21A. The second regions 22 have a small width in a direction perpendicular to a connecting direction, and arranged in parallel with each other. The first region 21 has a large width in the direction perpendicular to the direction in which the first and the second regions 21 and 22 are connected, and is connected to one end part of each of the second regions 22.

After the above step, the substrate is processed in the same manner as the steps illustrated in FIG. 6A and FIG. 6B to FIG. 16A and FIG. 16B. The gate should be formed, however, to spread over the second regions 32, as illustrated in FIG. 21B, and the source/drain parts should be formed to spread over the second regions 32, as illustrated in FIG. 21C.

Second Embodiment

A method of manufacturing a semiconductor device according to a second embodiment will be explained hereinafter with reference to FIG. 22A and FIG. 22B to FIG. 26A and FIG. 26B. Constituent elements which are the same as those illustrated in FIG. 1 to FIG. 3 are denoted by the same reference numbers, and detailed explanation thereof is omitted. FIG. 22A and FIG. 22B to FIG. 26A and FIG. 26B are cross-sectional views (A) and plan views (B), and the drawing (A) corresponds to cross section A-A' of the drawing (B).

First, an SGOI substrate is prepared by the method explained in the first embodiment. After an SGOI substrate 10 as illustrated in FIG. 3 is prepared, lithography is performed by using EB or excimer laser. Then, RIE is performed, and thereby a rectangular mesa region 50 illustrated in FIG. 22A and FIG. 22B is formed.

The mesa region 50 has a structure in which a first region 51 which is processed to have a source region in the end is connected with a second region 52 which is processed to have a channel region and a drain region in the end. The first and the second regions 51 and 52 have the same width. In addition, the composition of the mesa region 50 is the same as the $Si_{1-y}Ge_y$ layer 16 of the first embodiment, and the orientation of the side surfaces of the mesa region is the same as that in the first embodiment.

Next, as illustrated in FIG. 23A and FIG. 23B, after a thermal oxide film 17 which covers an upper part of the mesa region 50 is entirely removed by hydrofluoric acid, a silicon oxide film and a silicon nitride film are deposited on the whole surface of the wafer by CVD, and a protective film formed of a nitride film 53 or an oxide film 53' is formed on the first region 51 by photolithography and RIE. In the following steps, nitride film 53 is used as a protective film, but it can be replaced by oxide film 53'.

Figure 24A:
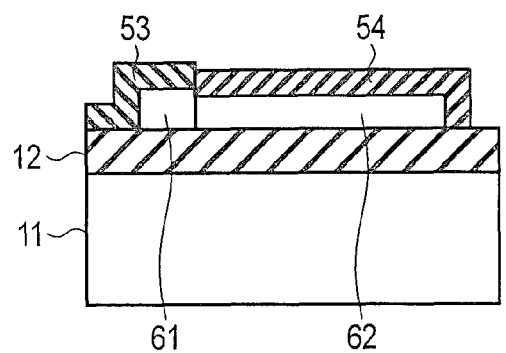
FIGS. 24A and 24B are a cross-sectional view and a plan view of a manufacturing step of the semiconductor device according to the second embodiment.
Figure 24B:
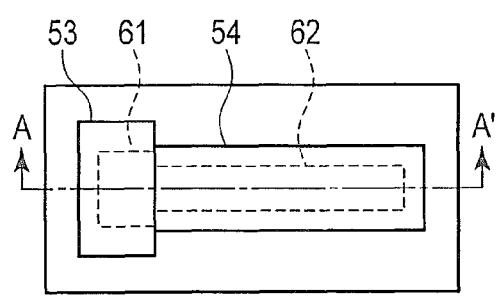

Next, the SGOI substrate is subjected to thermal oxidation in an oxygen atmosphere and at 800° C. or more. Thereby, as illustrated in FIG. 24A and FIG. 24B, an upper surface and side surfaces of a Fin region 62 are oxidized, and the Ge composition thereof increases. The source region 61 is, however, covered with the nitride film 53, and thus hardly oxidized, and the Ge composition thereof is not changed. Even when the source region 61 is oxidized, an oxide film thereof has a thickness which is sufficiently smaller than that of the Fin region 62. As a result, it is possible to form an SGOI-Fin in which the source region 61 has low Ge composition and the Fin region 62 has high Ge composition z. In the end, the source region 61 is covered with the nitride film 53, and the Fin region 62 is covered with a thermal oxide film 54. The end structure of the Fin, such as the width and the height, is the same as that in the first embodiment. Specifically, the Fin region 62 has a width of 5 to 20 nm, a height of 5 to 50 nm, and Ge composition of $0.3 < z \leq 1$, which is important for application.

Figure 25A:
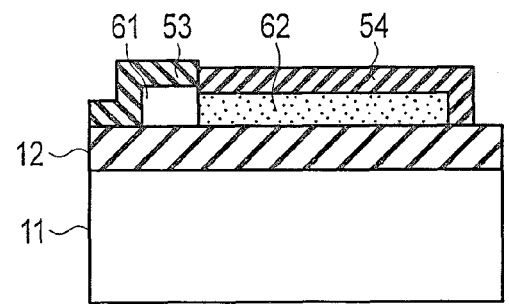
FIGS. 25A and 25B are a cross-sectional view and a plan view of a manufacturing step of the semiconductor device according to the second embodiment.
Figure 25B:
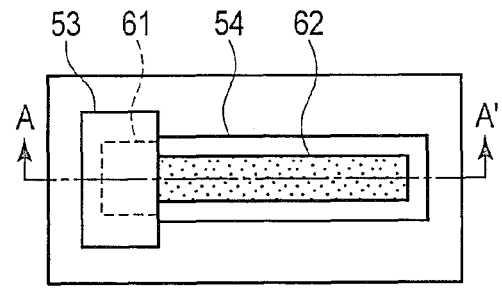

Next, as illustrated in FIG. 25A and FIG. 25B, the Fin which has gradation in the Ge composition is annealed in a rare gas or nitrogen gas atmosphere at high temperature. The atmosphere may include some oxygen (about 1% of the volume or less). The term "high temperature" indicates a high temperature at which the source region 61 which has a low Ge composition is not melted but only the Fin region 62 is melted. During the annealing, the thermal oxide film 54 and the nitride film 53 serve as coating, as illustrated in FIG. 25A and FIG. 25B. Therefore, only the Fin region 62 is changed to the liquid phase, and the source region 61 is in the solid phase, while Si and Ge inside are prevented from flowing out due to elimination and liquefaction. A specific example for determining the temperature is omitted herein, with reference to the first embodiment.

Next, after the Fin region 62 illustrated in FIG. 25A and FIG. 25B is changed to the liquid phase, the temperature is gradually decreased. Thereby, as illustrated in FIG. 26A and FIG. 26B, the SGOI-Fin is successively recrystallized from the source region 61 which has a low Ge composition toward the Fin region 62. FIG. 26A and FIG. 26B illustrate a transitional state, in which the Fin tip region is still in the liquid phase, or in a state where two phases exist together. When the temperature is further decreased, the Fin tip region is changed to the solid phase in the end, and recrystallization is finished.

After recrystallization is finished, the nitride film 53 in FIG. 26A and FIG. 26B is removed by phosphoric acid of about 150° C., and thereafter the thermal oxide film 54 is removed by hydrofluoric acid. Deposition of a gate layered film, gate lithography, and formation of source/drain regions to be performed thereafter are the same as the steps illustrated in FIG. 9 and the following drawings, and are thus omitted.

As described above, according to the present embodiment, the source region 51 is masked, and the Fin region 52 is subjected to Ge condensation, and thereby the Ge composition of the Fin region 62 can be increased to be higher than that of the source region 61. By using the difference in Ge composition, only the Fin region 62 can be melted and recrystallized. Therefore, the same effect as the first embodiment described above can be obtained.

In addition, according to the present embodiment, the rectangular mesa is formed on the SGOI substrate, and thereafter the nitride film 53 serving as a protective film is formed on the source region 51. After the protective film is formed, only Ge condensation is performed, and gradation of the Ge composition is formed. In this case, since the mesa is formed first in a rectangular shape, it is unnecessary to form a wide source region which is formed in the first embodiment, and thus the present embodiment is suitable for a scaling. Therefore, the present embodiment is suitable for semiconductor devices including a single channel, since the semiconductor devices can be more scaled than the first embodiment.

As a modification of the present embodiment, as illustrated in FIG. 27A and FIG. 27B, there is an example in which a $Si_{1-t}Ge_t$ layer 55 ($0<t\leq1$) is selectively and epitaxially grown by CVD on the Fin region 52 which is not covered with the nitride film 53, after the step of FIG. 23A and FIG. 23B. After the above step, three-dimensional Ge condensation is performed at a temperature of 800° C. or more in the same manner as above, and thereby it is possible to form an SGOI-Fin in which the source region 61 has low Ge composition and the Fin region 62 has high Ge composition z.

In the modification, a SiGe film is epitaxially grown after the protective film is formed, and then Ge condensation is performed to form gradation of the Ge composition. Although the modification has a fault that the process is complicated since the SiGe layer is epitaxially grown after the protective film 53 of the source region 51 is formed, the modification is effective when the rectangular width directly after RIE or the Ge composition is small.

In particular, in the case where the width of the Fin region is small, the channel may be divided in Ge condensation, due to edge roughness of the side surfaces of the Fin, which is generated in lithography such as RIE. In comparison with this, the problem of edge roughness can be reduced, when the channel width is increased by epitaxially growing the SiGe layer 55 and thereafter Ge condensation is performed as in the present modification. In addition, when the Ge composition is increased by Ge condensation in the state illustrated in FIG. 23A and FIG. 23B directly after RIE, the Ge composition of the source region 51 is also increased, and the latitude in selection of the temperature in melting may be narrowed. These cause a problem in view of the variability of the device characteristics resulting from the process. Therefore, the present modification in which the SiGe layer 55 is epitaxially grown after the protective film 53 of the source region 51 is formed is more effective for a scaling, although it has the disadvantage that the process is complicated.

Third Embodiment

A method of manufacturing a semiconductor device according to a third embodiment will be explained hereinafter, with reference to FIG. 28A and FIG. 28B to FIG. 32. FIG. 28A and FIG. 28B to FIG. 30A and FIG. 30B illustrate cross-sectional views (A) and plan views (B), and the drawing (A) corresponds to cross section A-A' of the drawing (B).

First, an SGOI substrate is prepared by the method explained in the first embodiment. After the SGOI substrate 10 as illustrated in FIG. 3 is prepared, lithography is performed by using EB or excimer laser. Then, RIE is performed, and thereby a rectangular mesa region (first SiGe layer) 50 as illustrated in FIG. 22A and FIG. 22B is formed.

The mesa region 50 has the same width, height, and orientation as has the end Fin of the first embodiment, and the composition of the mesa region 50 is $Si_{1-z}Ge_z$ which is the same as the source region 62 of the first embodiment. Specifically, the end Fin region 52 has a width of 5 to 20 nm, a height of 5 to 50 nm, and Ge composition of $0.3<z\leq1$, which is important for application.

The mesa region 50 has a structure in which a first region 51 which serves as a source region in the end is connected with a second region 52 which serves as a channel region and a drain region in the end. The first and the second region 51 and 52 have the same width.

Next, as illustrated in FIG. 28A and FIG. 28B, a nitride film 73 is formed on the Fin region 52 by CVD and lithography with RIE. Thereafter, as illustrated in FIG. 29A and FIG. 29B, a $Si_{1-t}Ge_t$ layer (second SiGe layer) 74, which has Ge composition lower than Ge composition z in the source region 51 and the Fin region 52, is epitaxially grown by CVD on the source region 51. From the view point of melting which follows this step, it is desirable that t is smaller than z by 0.4 or more. Thereby, gradation of Ge composition is formed between the $Si_{1-t}Ge_t$ layer 74 and the Fin region 52 and the source region 51.

Next, as illustrated in FIG. 30A and FIG. 30B, another nitride film is deposited on the $Si_{1-t}Ge_t$ layer 74 and the nitride film 73, to form a nitride film 75 which covers the whole SGOI-Fin. Thereafter, the SGOI substrate on which the SGOI-Fin is entirely covered with an insulator is annealed in a rare gas or nitrogen gas atmosphere at high temperature. The atmosphere may include some oxygen (about 1% of the volume or less). The term "high temperature" indicates a temperature at which only the mesa region 50 which includes the Fin region 52 and the source region 51 that have high Ge composition z is melted, while the $Si_{1-t}Ge_t$ layer 74 that has low Ge composition is not melted. During annealing, the nitride film 75 serves as coating, and prevents Si and Ge located inside from flowing out due to elimination and liquefaction. Therefore, only the mesa region 50 which includes the Fin region 52 and the source region 51 is changed to the liquid phase, and the $Si_{1-t}Ge_t$ layer 74 is in the solid phase or a partly-melted state. A specific example relating to determination of the temperature is omitted herein, only with reference to the first embodiment.

Next, after the mesa region 50 including the Fin region 52 and the source region 51 illustrated in FIG. 31 is changed to the liquid phase, the temperature is gradually decreased. Thereby, as illustrated in FIG. 32, the SGOI-Fin is successively recrystallized into the solid phase from the $Si_{1-t}Ge_t$ layer 74 having low Ge composition to the source region 51 and the Fin region 52. FIG. 32 illustrates a transitional state, in which the Fin tip region is still in the liquid phase, or a state in which two phases exist together. When the temperature is further decreased, the Fin tip region is changed to the solid phase in the end, and recrystallization is finished. After recrystallization is finished, the nitride film 75 in FIG. 32 is removed by phosphoric acid of about 150° C., in the same manner as the first embodiment. Deposition of a gate layered film, gate lithography, and formation of source/drain regions to be performed thereafter are the same as the steps illustrated in FIG. 9 and the subsequent drawings, and are thus omitted.

As described above, according to the present embodiment, a SiGe layer 74 having low Ge concentration is formed on the source region 51, and thereby the Ge composition of the mesa region 50 which includes the source region 51 and the Fin region 52 can be higher than that of the SiGe layer 74. By using the difference in Ge composition, only the mesa region 50 can be melted and recrystallized. Therefore, the same effect as the first embodiment described above can be obtained.

In addition, according to the present embodiment, the rectangular mesa is formed first on the SGOI substrate. Therefore, it is unnecessary to form a wide source region, and thus the present embodiment is more suitable for a scaling than the first embodiment. The present embodiment is the same as the second embodiment with respect to scaling.

Besides, according to the present embodiment, the protective film 73 is formed only on the Fin region 52, the SiGe layer 74 is epitaxially grown on the source region 51, and thereby gradation of the Ge composition is formed between the Fin region (actually, the source region 51 and the Fin region 52) and the source region (actually, the SiGe layer 74). Therefore, the process of the present embodiment is more complicated, since the epitaxial growth step is added to the process in comparison with the first embodiment. The present embodiment is considered to be equal to the second embodiment in the number of steps of the process, since an epitaxial growth step is added to the process although no Ge condensation is performed in the present embodiment.

However, since epitaxial growth can be performed by freely selecting the Ge composition of the source region in the present embodiment, gradation of Ge composition between the Fin region and the source region can be formed most easily, in comparison with the case of using only Ge condensation. Therefore, the present embodiment has wide latitude in selection of the temperature used in melting, and thus can be expected to achieve most stable melting and recrystallization.

As a modification of the present embodiment, it is possible to use the substrate illustrated in FIG. 4, instead of the SGOI substrate illustrated in FIG. 3.

After the SGOI substrate illustrated in FIG. 4 is prepared, a rectangular mesa region 80 illustrated in FIG. 33A and FIG. 33B by lithography using EB or an excimer laser and RIE.

Then, as illustrated in FIG. 34A and FIG. 34B, Ge condensation is performed for the mesa region 80, and thereby a mesa region 82 which has a high Ge composition and a thermal oxide film 82.

Thereafter, after the thermal oxide film 82 is removed, an nitride film 73 is deposited by CVD on the Fin region of the mesa region 81, as illustrated in FIG. 28A and FIG. 28B. Then, the substrate is processed in the same manner as the above process, and thereby the Fin region can be melted and crystallized.

In the modification, Ge condensation is performed before a protective film of the Fin region is formed, and thereby Ge composition of the region to be melted is increased. Therefore, it is possible to obtain a Fin region which has a Ge composition higher than that of the third embodiment, and form higher gradation of Ge composition between the SiGe layer 74 to be formed on the source region and the mesa region 81 easily. Although the third embodiment can produce the same effect as the present modification by using a substrate which has a high Ge composition, more oxide film is formed in this case and thus the time of oxidation is expected to be long. In comparison with this, the present modification can shorten the oxidation time, since Ge condensation is performed in a three-dimensional manner.

Figure 35A:
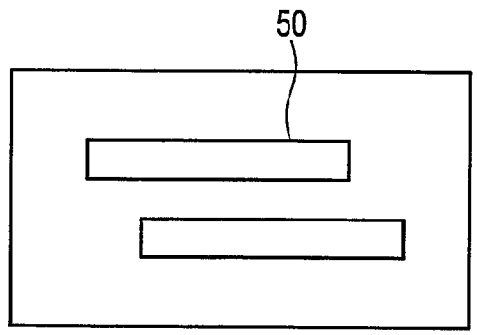
FIGS. 35A and 35B are plan views for explaining the modification of the third embodiment.
Figure 35B:
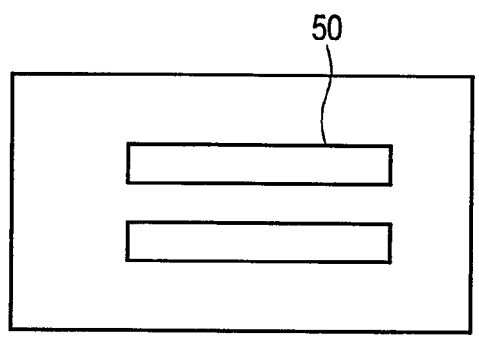
Figure 36A:
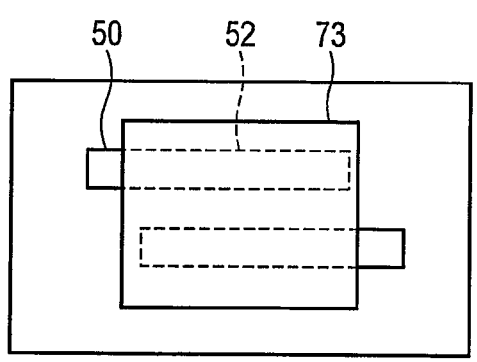
FIGS. 36A and 36B are plan views for explaining the modification of the third embodiment.
Figure 36B:
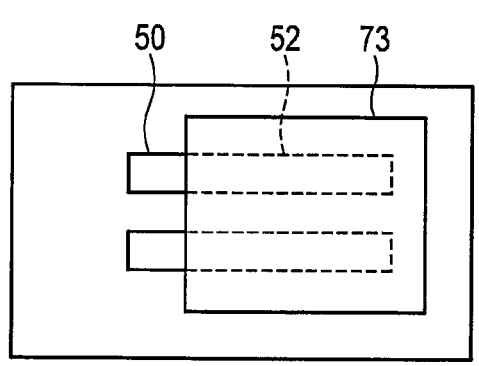

In addition, when the second and the third embodiments are applied to a multi-channel Fin, a mesa region 50 formed of SiGe is processed into a plurality of rectangular islands, as illustrated in FIG. 35A and FIG. 35B. Then, in the case of applying the third embodiment, Fin regions 52 are masked with a nitride film 73, as illustrated in FIG. 36A and FIG. 36B. Thereafter, the Fin regions can be melted and recrystallized by the steps illustrated in FIG. 29A and FIG. 29B to FIG. 32. In the case of applying the second embodiment, source regions 51 are masked with a nitride film 53 while Fin region is masked in FIG. 36A and FIG. 36B, and the Fin regions are subjected to Ge condensation, melting, and recrystallization by the steps illustrated in FIG. 24A and FIG. 24B to FIG. 26A and FIG. 26B.

In the first to third embodiments, the time required for melting and recrystallization of SiGe is desirably as short as possible to avoid Ge composition distribution due to phase separation in recrystallization. Therefore, rapid thermal annealing (RTA), spike RTA, or a rapid annealing device using a flash lamp and laser should be used. The maintaining time to a temperature of 900° C. or more at which Ge is remarkably diffused is 1 minute or less, more preferably 10 seconds or less.

Fourth Embodiment

The present embodiment is a modification of the methods of manufacturing a three-dimensional channel transistor explained in the first to third embodiments, in which the process performed after the Fin region is melted and recrystallized is changed. Specifically, although the recrystallized Fin region is used as the channel region in the first to third embodiments, a Fin region which is relaxed by recrystallization is used as a stressor in the present embodiment. In addition, a SiGe film is epitaxially grown around the Fin region, to form a SiGe channel. Therefore, the present embodiment is applicable to any of the first to third embodiments.

A method of manufacturing a semiconductor device according to a fourth embodiment will be explained hereinafter with reference to FIG. 37A, FIG. 37B, FIG. 38A and FIG. 38B. FIG. 37A, FIG. 37B, FIG. 38A and FIG. 38B are cross-sectional views (A) and plan views (B), and the drawing (A) corresponds to cross section A-A' of the drawing (B).

Preparation of the SGOI substrate and recrystallization of the Fin region are the same as those in the first to third embodiments, and explanation thereof is omitted. The recrystallized SGOI substrate has a structure in which the source region 31 has Ge composition lower than that of the Fin region 32, and all the regions are covered with an insulating film 19 formed of a thermal oxide film or a nitride film, as illustrated in, for example, FIG. 8A and FIG. 8B.

The insulating film 19 is removed by hydrofluoric acid or thermal phosphoric acid, a $Si_{1-u}Ge_u$ ($0<u<1$) which serves as a channel region 91 is epitaxially grown by CVD, as illustrated in FIG. 37A and FIG. 37B. Supposing that the Ge composition of the Fin region 32 is z, epitaxial growth is performed such that $z<u$ is satisfied and compressive strain is applied to the channel region 91, when a p-MOSFET is prepared. When an n-MOSFET is prepared, epitaxial growth is performed such that $u<z$ is satisfied and tensile strain is applied to the channel region 91. In both cases of preparing an n-MOSFET and a p-MOSFET, it is desirable that the Ge composition u of the epitaxially grown channel region 91 has a difference of 0.2 or more from the Ge composition z of the recrystallized stressor layer (Fin region 32). Specifically, in either case, it is desirable to satisfy |z−u|≥0.2.

Thereafter, a layered gate and a side-wall insulating film are formed in the same manner as the first embodiment. These steps are the same as those illustrated in FIG. 9A and FIG. 9B to FIG. 12A and FIG. 12B of the first embodiment, and explanation thereof is omitted. Then, as illustrated in FIG. 38A and FIG. 38B, a gate layered part formed of a gate insulating film 41 and a gate electrode 42, and a gate side-wall insulating film 44 are formed, and thereafter ions are implanted into the source/drain regions in the same manner as the first embodiment. Thereafter, recrystallization annealing is performed, a metal layer is deposited on the whole surface, and a germanosilicide region 47 is formed by heat treatment.

Thereafter, an interlayer insulating film is deposited, and contact holes for the source/drain regions and the gate electrode are formed. This step is also the same as that of the first embodiment, and explanation thereof is omitted.

As described above, according to the present embodiment, it is possible to form a three-dimensional channel transistor, in which the Fin region prepared in the first to third embodiments is used as a stressor. Since lattice strain is relaxed and crystal defects are reduced in the Fin region, it is easy to apply compressive strain to the pMOS side and apply tensile strain to the nMOS side. Therefore, the present embodiment is effective for preparing a C-MOS circuit.

Fifth Embodiment

A method of manufacturing a semiconductor device according to a fifth embodiment will be explained hereinafter, with reference to FIG. 39A to FIG. 39G.

The present embodiment shows a method of manufacturing a C-MOSFET using the methods of manufacturing a three-dimensional channel transistor explained in the first to fourth embodiments. Although a method of using the second embodiment is specifically explained as an example with reference to drawings, all the other embodiments, that is, the first, third, and fourth embodiments may be used. In the following explanation, each drawing is a plan view of an SGOI substrate. Explained is a process in which an upper Fin region in the drawing is a p-MOSFET, and a lower Fin region is an n-MOSFET. The positions of the n-MOSFET and the p-MOSFET may be reversed.

First, an SGOI substrate 10 is prepared as explained in the first embodiment.

Figure 39A:
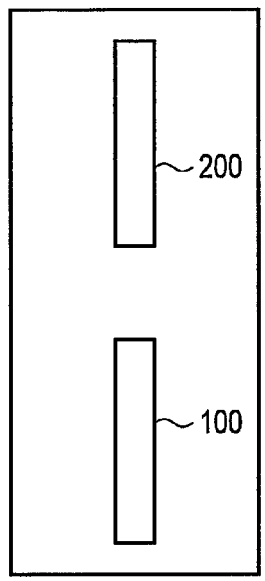

Then, as illustrated in FIG. 39A, the substrate is processed by RIE to have mesa parts, and thereby mesa regions 100 and 200 are formed. Although not shown, ions are implanted into channel regions of the respective mesa regions to form an n-MOSFET and a p-MOSFET. Specifically, in the case where ion implantation is performed for the mesa region 100, an insulating film or the like is deposited on the mesa region 200, and boron ions are implanted into the mesa region 100 when an n-MOSFET is formed in the mesa region 100. When a p-MOSFET is formed in the mesa region 100, phosphorus ions or arsenic ions are implanted into the mesa region 100.

Figure 39B:
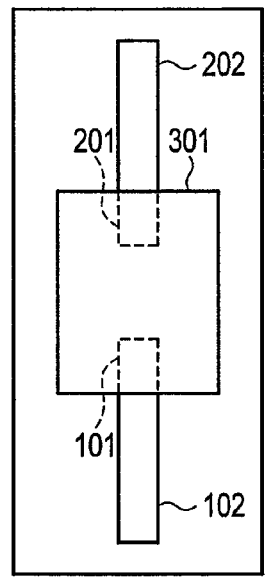

Thereafter, as illustrated in FIG. 39B, a nitride film 301 is deposited by CVD, to mask a first region (source region) 101 of the mesa region 100 and a second region (source region) 201 of the mesa region 200, in the same manner as the second embodiment.

Figure 39C:
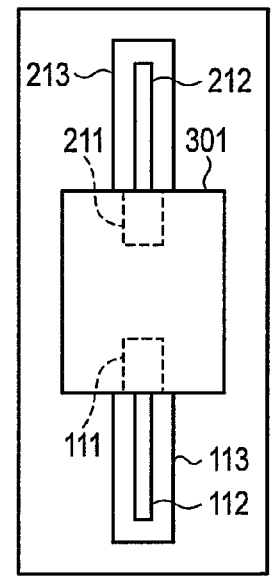

Then, Ge condensation, melting, and recrystallization are performed as explained in the second embodiment, and thereby Fin regions 112 and 212, each of which has a lattice-relaxed SiGe channel, as illustrated in FIG. 39C. Regions 111 and 211 are source regions having low Ge composition.

Figure 39D:
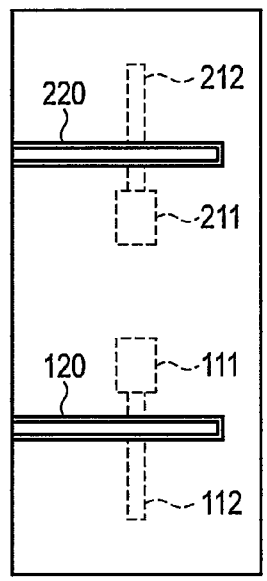

Thereafter, thermal oxide films 113 and 213, and the nitride film 301 used for forming the source regions are removed by hydrofluoric acid and thermal phosphoric acid, respectively. Thereafter, as illustrated in FIG. 39D, gate regions 120 and 220, each of which includes a gate layered structure and gate side walls, are formed by the method explained in the first embodiment.

Figure 39E:
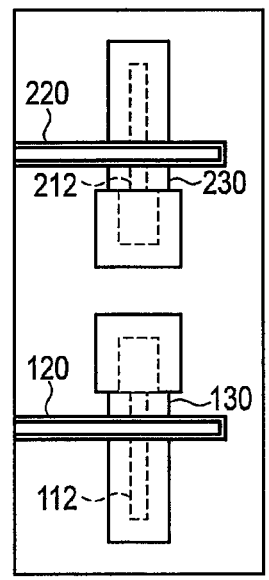

Then, as illustrated in FIG. 39E, SiGe stressors 130 and 230 are epitaxially grown by CVD for an n-FinFET region and a p-FinFET region, respectively.

At this step, when SiGe stressor layers of different concentrations are formed, a SiGe stressor layer is epitaxially grown on the Fin region and source/drain regions, on which the SiGe stressor layer is to be formed, in the state where the other Fin region and source/drain regions are covered with an insulating film or the like. The p- and n-FinFET regions have the same Ge composition, since they are formed through the same process. The Ge composition is denoted by z. A $Si_{1-s}Ge_s$ (0<z<s) layer 130 which serves as a compressive strain stressor is formed on the p-FinFET, and a $Si_{1-s'}Ge_{s'}$ (0<s'<z) layer 230 which serves as a tensile strain stressor is formed on the n-FinFET. It is desirable that there is a difference of 0.2 or more between s and z and between s' and z. Specifically, it is desirable to satisfy z−s'≥0.2 and s−z≥0.2.

Thereafter, as illustrated in FIG. 39F, metal is deposited on the source regions 111 and 211 and the Fin regions 112 and 212, and germanosicilide regions 140 and 240 are formed, as explained in the first embodiment.

Then, an interlayer insulating film is deposited, and contact holes for the source/drain regions and the gate electrode are formed, in the same manner as the first embodiment. As illustrated in FIG. 39G, via holes 150 and 250 are formed by filling the contact holes with a conductive material. Thereafter, after electrodes thereof are formed, wires are formed on the interlayer insulating film, and thereby a circuit which includes a C-MOS transistor is finished.

As described above, according to the present embodiment, the strain stressors 130 and 230, which are different between the nMOS and the pMOS, are formed for the Fin region prepared in the first to third embodiments, and thereby it is possible to prepare a C-MOS which has strain channels suitable for the respective type of MOSFETs. In this case, lattice strain is relaxed and crystal defects are reduced in the Fin regions 112 and 212. Therefore, it becomes easy to apply compressive strain to the pMOS and apply tensile strain to the nMOS, which is effective for preparing a C-MOS circuit.

Although the Fin regions of the nMOS and the pMOS are formed to have the same Ge composition in the method of preparing a C-MOS in the fifth embodiment, the following is a method of preparation in which the nMOS and pMOS have different Ge compositions. As illustrated in FIG. 40A, a mesa region 250, which is expected to have higher Ge composition, is formed with a width larger than that of the other mesa region 150. As another method, epitaxial growth may be performed for the mesa region 250, which is formed with the same width as the mesa region 150, after RIE.

Thereafter, as illustrated in FIG. 40B, only the mesa region which has a lower Ge composition is covered with an insulating film 170, and then Ge condensation is performed. Thereby, only the mesa region 250 having a larger width is subjected to Ge condensation. Therefore, only an upper mesa region 260 in FIG. 40B has increased Ge composition. Thereby, it is possible to obtain SGOI-Fins which have the same width and different Ge compositions between n and p.

Then, after a thermal oxide film 263 which is generated by Ge condensation is removed by hydrofluoric acid, an insulating film 301 is deposited to cover source regions 151 and 261, as illustrated in FIG. 40C. Steps subsequent to the above step are the same as those illustrated in FIG. 39B and subsequent drawings of the fifth embodiment, and explanation thereof is omitted.

By means of the above method, it is possible to prepare a C-MOS which has different Ge compositions between the n- and the p-MOSFETs.

MODIFICATION EXAMPLES

The present invention is not limited to the above embodiments. For example, in all the above embodiments, a Fin region which has (110) faces on its side surfaces is formed from an SOI substrate which has a (001) face as its main surface. However, it is also possible to form a Fin which has {110} faces that is equivalent to a (110) face as its side surfaces on a semiconductor substrate that has a {001} face that is equivalent to a (001) face as its main surface. When compressive strain is applied to the {110} faces in a pMOSFET, the current driving force can be particularly increased. In the above explanation, the term "{001} face" is a comprehensive expression of a Miller index which indicates any of (001) face, (010) face, (100) face, (00-1) face, (0-10) face, and (−100) face. In addition, the term "{110} face" is a comprehensive expression of a Miller index which indicates any of (110) face, (101) face, (011) face, (−1-10) face, (−10-1) face, (0-1-1) face, (−110) face, (1-10) face, (10-1) face, (−101) face, (01-1) face, and (0-11) face. The term "{111} face" is a comprehensive expression of a Miller index which indicates any of (111) face, (−111) face, (1-11) face, (11-1) face, (−1-1-1) face, (1-1-1) face, (−11-1) face, and (−1-11) face.

It is also possible to form a Fin region which has {001} faces in its side surfaces on a substrate which has a {100} face as its main surface, in accordance with the above Miller indices. In this case, it is possible to increase the current driving force, in particular, in the nMOS.

For example, the material of the insulating film which selectively masks the first region or the second region can be properly changed, according to the specification. In addition, the support substrate is not necessarily limited to Si, but another semiconductor substrate may be used. It is also possible to use a crystal substrate such as sapphire as the support substrate. In the case of using sapphire, a SiGe layer can be formed directly on the support substrate.

Besides, although the Fin region is used as a strain stressor in the fourth embodiment and SiGe channel is formed by epitaxially grown a SiGe film around the Fin region, a Si layer may be epitaxially grown instead of the SiGe layer. In the case of growing a Si layer, it is possible to prepare a MOSFET using a strained Si channel.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:

forming a first SiGe layer on an insulating film;

processing the first SiGe layer to have an island shape which includes a first region and a second region that is connected to the first region, the first region having a width larger than a width of the second region in a direction perpendicular to a connecting direction of the second region;

subjecting the first SiGe layer having the island shape to thermal oxidation, thereby increasing Ge composition of the first region and Ge composition of the second region, and setting the Ge composition of the second region to be higher than the Ge composition of the first region;

melting the second region having the increased Ge composition by heat treatment; and recrystallizing the melted second region from an interface between the first region and the second region.

2. The method of claim 1, wherein
one of source/drain regions of an MOS transistor is formed in the first region, and a channel is formed together with the other of the source/drain regions of the MOS transistor in the second region.

3. The method of claim 1, wherein
the forming the first SiGe layer includes forming a Si layer on the insulating film, forming a SiGe material layer which has a Ge composition lower than the Ge composition of the first SiGe layer on the Si layer, and thereafter performing thermal oxidation in an oxygen atmosphere.

4. The method of claim 3, wherein
a Si layer or a SiO$_2$ film is formed on the SiGe material layer, before the thermal oxidation.

5. The method of claim 1, wherein
a gate electrode is formed on part of the second region with a gate insulating film interposed therebetween after the second region is recrystallized, then a side-wall insulating film is formed on side walls of the gate electrode, and thereafter a strain stressor layer, which is formed of a SiGe layer that has Ge composition different from the Ge composition of the second region and is configured to apply lattice strain to the second region, is formed on the first region and the second region.

6. The method of claim 1, wherein
the processing the first SiGe layer to have the island shape includes forming a plurality of second regions which are arranged in parallel with each other.

7. The method of claim 1, wherein
the processing the first SiGe layer to have the island shape includes forming a hard mask which corresponds to the island pattern on the first SiGe layer, and thereafter performing selective etching of the first SiGe layer.

8. The method of claim 1, wherein
the melting the second region includes heating the first SiGe layer having the island shape to a temperature, at which the first region is not melted but the second region is melted.

9. The method of claim 1, wherein
a surface of the first SiGe layer is covered with an oxide film, by the subjecting the first SiGe layer to thermal oxidation.

10. A method of manufacturing a semiconductor device, comprising:

forming a first SiGe layer on an insulating film;

processing the first SiGe layer to have an island shape which includes a first region and a second region that is connected to the first region;

covering the first region with a mask which is formed of an insulating film;

subjecting the second region, which is not covered with the mask, of the first SiGe layer to thermal oxidation, thereby increasing Ge composition of the second region, and setting the Ge composition of the second region to be higher than Ge composition of the first region;

melting the second region having the increased Ge composition by heat treatment; and recrystallizing the melted second region from an interface between the first region and the second region.

11. The method of claim 10, wherein
a second SiGe layer is epitaxially grown on the second region, which is not covered with the mask, of the first SiGe layer, before the second region is subjected to the thermal oxidation.

12. The method of claim 10, wherein
one of source/drain regions of an MOS transistor is formed in the first region, and a channel is formed together with the other of the source/drain regions of the MOS transistor in the second region.

13. The method of claim 10, wherein
the forming the first SiGe layer includes forming a Si layer on the insulating film, forming a SiGe material layer which has a Ge composition lower than the Ge composition of the first SiGe layer on the Si layer, and thereafter performing thermal oxidation in an oxygen atmosphere.

14. The method of claim 10, wherein
a gate electrode is formed on part of the second region with a gate insulating film interposed therebetween after the second region is recrystallized, then a side-wall insulating film is formed on side walls of the gate electrode, and thereafter a strain stressor layer, which is formed of a SiGe layer that has Ge composition different from the Ge composition of the second region and is configured to apply lattice strain to the second region, is formed on the first region and the second region.

15. A method of manufacturing a semiconductor device, comprising:

forming a first SiGe layer on an insulating film;

processing the first SiGe layer to have an island shape which includes a first region and a second region that is connected to the first region;

covering the second region with a first mask which is formed of an insulating film;

epitaxially growing a second SiGe layer which has a Ge composition lower than the Ge composition of the first region on the first region that is not covered with the first mask in the first SiGe layer;

covering the first SiGe layer and the second SiGe layer with a second mask which is formed of an insulating film;

melting the first SiGe layer which is covered with the first and second mask by heat treatment; and recrystallizing the melted first SiGe layer from an interface between the first SiGe layer and the second SiGe layer.

16. The method of claim 15, wherein
after the first SiGe layer is processed to have the island shape, the first SiGe layer is subjected to thermal oxidation before the second region is covered with the first mask, and thereby Ge composition of the first SiGe layer is increased.

17. The method of claim 15, wherein
one of source/drain regions of an MOS transistor is formed in, the first region, and a channel is formed together with the other of the source/drain regions of the MOS transistor in the second region.

18. The method of claim 15, wherein
the forming the first SiGe layer includes forming a Si layer on the insulating film, forming a SiGe material layer which has a Ge composition lower than the Ge composition of the first SiGe layer on the Si layer, and thereafter performing thermal oxidation in an oxygen atmosphere.

19. The method of claim 15, wherein
a gate electrode is formed on part of the second region with a gate insulating film interposed therebetween after the second region is recrystallized, then a side-wall insulating film is formed on side walls of the gate electrode, and thereafter a strain stressor layer, which is formed of a SiGe layer that has Ge composition different from the Ge composition of the second region and is configured to apply lattice strain to the second region, is formed on the first region and the second region.

* * * * *